United States Patent
Hashimoto et al.

(10) Patent No.: US 10,395,952 B2
(45) Date of Patent: Aug. 27, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventors: Koji Hashimoto, Kyoto (JP); Naoyuki Osada, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/901,955

(22) Filed: Feb. 22, 2018

(65) Prior Publication Data
US 2018/0277399 A1    Sep. 27, 2018

(30) Foreign Application Priority Data
Mar. 24, 2017   (JP) ................................. 2017-060046

(51) Int. Cl.
*H01L 21/67*       (2006.01)
*H01L 21/306*      (2006.01)

(52) U.S. Cl.
CPC .... *H01L 21/6708* (2013.01); *H01L 21/30604* (2013.01); *H01L 21/67017* (2013.01); *H01L 21/67028* (2013.01); *H01L 21/67103* (2013.01); *H01L 21/67109* (2013.01); *H01L 21/67167* (2013.01); *H01L 21/67248* (2013.01)

(58) Field of Classification Search
None
See application file for complete search history.

(56) References Cited

U.S. PATENT DOCUMENTS

2016/0268146 A1*  9/2016  Kobayashi .......... H01L 21/6715

FOREIGN PATENT DOCUMENTS

JP        2013-172079 A      9/2013

* cited by examiner

*Primary Examiner* — Jiong-Ping Lu
(74) *Attorney, Agent, or Firm* — Ostrolenk Faber LLP

(57) ABSTRACT

A substrate processing apparatus includes a processing liquid distributing member that partitions, by an inner wall surface, at least part of a processing liquid distribution passage communicating with a discharge port, a processing liquid supplying unit that supplies the high-temperature processing liquid having a higher temperature than a room temperature to the processing liquid distribution passage, a temperature changing unit arranged to heat or cool an outer wall surface of the processing liquid distributing member from the outside to change a temperature of the processing liquid distributing member, and a controller that executes an equilibrium temperature maintaining step of maintaining the inner wall surface of the processing liquid distributing member at a thermal equilibrium temperature by controlling the temperature changing unit in a state where no processing liquid is supplied from the processing liquid supplying unit to the processing liquid distribution passage.

5 Claims, 13 Drawing Sheets

FIG. 6 Discharge stop state

FIG. 7 Discharge state

FIG. 8 Suctioning and removing state

Chemical liquid
Tc(about 82°C)

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In a manufacturing process of semiconductor apparatuses or liquid crystal display devices, a substrate such as a semiconductor wafer or a glass substrate for the liquid crystal display device is processed with a processing liquid. For example, a single substrate processing type substrate processing apparatus that processes one substrate at a time includes a spin chuck that rotates a substrate while horizontally holding the substrate, and a nozzle that supplies a processing liquid to a front surface of the substrate which is held by the spin chuck. There is a substrate processing apparatus in which a processing liquid whose temperature is adjusted to a predetermined high temperature is supplied to a nozzle (for example, Japanese Patent Application Publication No. 2013-172079).

SUMMARY OF THE INVENTION

However, in the substrate processing apparatus described in Japanese Patent Application Publication No. 2013-172079, in a state where discharge from the nozzle is stopped, temperatures of a pipe wall of the nozzle and a pipe wall of a processing liquid piping are lowered. Therefore, when processing using a high-temperature processing liquid is restarted after a long period of time elapses after the previous processing using the high-temperature processing liquid, there is a possibility that the high-temperature processing liquid fed to the processing liquid piping and the nozzle is cooled by heat exchange with the pipe wall of the nozzle and the pipe wall of the processing liquid piping having a low temperature. Thus, there is a possibility that at the time of restarting the processing using the high-temperature processing liquid, the processing liquid whose temperature is lowered is supplied to a substrate. When the high-temperature processing liquid has a lower temperature than a desired temperature, a problem in which the processing rate is lowered, etc., occurs. In a case where the processing is consecutively performed after that, the temperatures of the pipe walls are raised with the number of times of the processing, and the processing liquid having the desired high temperature is discharged from the nozzle. Therefore, there is a possibility that variations in processing between the substrates due to such thermal influence occur.

That is, in a case where the high-temperature processing is repeatedly and consecutively performed on the plural substrates, it is required to reduce or prevent variations in processing between the substrates due to such thermal influence.

Therefore, an object of the present invention is to provide a substrate processing apparatus and a substrate processing method, with which variations in processing between the substrates can be reduced or prevented.

A first aspect of the present invention is to provide a substrate processing apparatus including a substrate holding unit that holds a substrate, a processing liquid distributing member having an inner wall surface and an outer wall surface, the processing liquid distributing member that partitions, by the inner wall surface, at least part of a processing liquid distribution passage communicating with a discharge port from which a processing liquid is discharged to the substrate which is held by the substrate holding unit, a processing liquid supplying unit that supplies the high-temperature processing liquid having a higher temperature than a room temperature to the processing liquid distribution passage, a temperature changing unit arranged to heat or cool the outer wall surface of the processing liquid distributing member from the outside to change a temperature of the processing liquid distributing member, and a controller that executes a substrate processing step of processing the substrate held by the substrate holding unit by controlling the processing liquid supplying unit to supply the high-temperature processing liquid having a higher temperature than the room temperature to the processing liquid distribution passage and discharge the high-temperature processing liquid from the discharge port, and an equilibrium temperature maintaining step of maintaining the inner wall surface of the processing liquid distributing member at a thermal equilibrium temperature by controlling the temperature changing unit in a state where no processing liquid is supplied from the processing liquid supplying unit to the processing liquid distribution passage.

In the present description, the thermal equilibrium temperature indicates a temperature of the inner wall surface of the processing liquid distributing member converging in a case where the substrate processing step is repeatedly and consecutively executed.

With this configuration, by heating or cooling the outer wall surface of the processing liquid distributing member by the temperature changing unit to change the temperature of the processing liquid distributing member, in a state where no high-temperature processing liquid is supplied to the processing liquid distribution passage, the inner wall surface of the processing liquid distributing member is maintained at the thermal equilibrium temperature.

The thermal equilibrium temperature is the temperature of the inner wall surface converging in a case where the substrate processing step is repeatedly and consecutively executed. By maintaining the inner wall surface of the processing liquid distributing member at the thermal equilibrium temperature in a state where no high-temperature processing liquid is supplied to the processing liquid distribution passage, in the substrate processing step to be executed next, the inner wall surface of the processing liquid distributing member is maintained at the thermal equilibrium temperature. In addition, in the substrate processing step to be executed repeatedly after that, the inner wall surface of the processing liquid distributing member is also maintained at the thermal equilibrium temperature. That is, the temperature of the inner wall surface is unchanged.

The high-temperature processing liquid supplied to the processing liquid distribution passage is brought into contact with the inner wall surface of the processing liquid distributing member maintained at the thermal equilibrium temperature, and then discharged from the discharge port. Since the temperature of the inner wall surface is unchanged, the temperature of the processing liquid from the discharge port can be uniformly maintained over plural substrate processing steps. Thereby, variations in processing between the substrates can be reduced or prevented.

In a preferred embodiment of the present invention, the controller executes a step of maintaining the inner wall surface at the thermal equilibrium temperature and maintaining the outer wall surface at a predetermined temperature which is higher than the room temperature and lower than the thermal equilibrium temperature in the equilibrium temperature maintaining step.

With this configuration, the outer wall surface is maintained at the predetermined temperature which is higher than the room temperature and lower than the thermal equilibrium temperature. Thereby, it is possible to reduce or prevent heat from entering and exiting the outer wall surface. In other words, it is possible to reduce or prevent heat from entering and exiting the processing liquid distributing member. Therefore, the inner wall surface can be continuously maintained in a state of thermal equilibrium.

The controller may execute, at the beginning of the equilibrium temperature maintaining step, a first heating step of heating the outer wall surface in order to raise the temperature of the outer wall surface to a higher temperature than the thermal equilibrium temperature, a cooling step of, subsequent to the first heating step, cooling the outer wall surface in order to lower the temperature of the outer wall surface to a lower temperature than the temperature of the processing liquid, and a second heating step of, subsequent to the cooling step, heating the outer wall surface so that the inner wall surface is maintained at the thermal equilibrium temperature and the temperature of the outer wall surface is maintained at the predetermined temperature.

With this configuration, at the beginning of the equilibrium temperature maintaining step, first, by heating the outer wall surface by the temperature changing unit, the temperature of the outer wall surface is raised to a higher temperature than the thermal equilibrium temperature. Next, by cooling the outer wall surface by the temperature changing unit, the temperature of the outer wall surface is lowered. Next, by heating the outer wall surface by the temperature changing unit, the inner wall surface of the processing liquid distributing member is maintained at the thermal equilibrium temperature, and the temperature of the outer wall surface is maintained at the predetermined temperature. In this way, a state where the inner wall surface of the processing liquid distributing member is maintained at the thermal equilibrium temperature and the outer wall surface is maintained at the predetermined temperature which is higher than the room temperature and lower than the thermal equilibrium temperature can be realized by a relatively simple method.

In the substrate processing apparatus, the controller adjusts the thermal equilibrium temperature set in the equilibrium temperature maintaining step according to the temperature of the processing liquid used in the substrate processing step which is executed subsequent to the equilibrium temperature maintaining step, and the controller executes the equilibrium temperature maintaining step based on the set thermal equilibrium temperature.

With this configuration, in a case where high-temperature processing liquids having temperatures different from each other are used in two substrate processing steps, in the equilibrium temperature maintaining step executed between the two substrate processing steps, the inner wall surface of the processing liquid distributing member is adjusted to the thermal equilibrium temperature corresponding to the temperature of the processing liquid used in the substrate processing step to be executed next. Thereby, in the subsequent to substrate processing step to be executed, the inner wall surface of the processing liquid distributing member is continuously maintained at the thermal equilibrium temperature. Thereby, even in a case where the temperature of the high-temperature processing liquid to be discharged is changed midway, it is possible to reduce or prevent variations in high-temperature processing between the substrates after that.

The processing liquid distributing member may include a nozzle having a discharge port.

With this configuration, by heating or cooling an outer wall surface of the nozzle by the temperature changing unit to change a temperature of the nozzle, an inner wall surface of the nozzle is maintained at the thermal equilibrium temperature in a state where no high-temperature processing liquid is supplied into the nozzle.

The thermal equilibrium temperature is a temperature of the inner wall surface of the nozzle converging in a case where the substrate processing step is repeatedly and consecutively executed. By maintaining the inner wall surface of the nozzle at the thermal equilibrium temperature in a state where no high-temperature processing liquid is supplied to the processing liquid distribution passage, in the substrate processing step to be executed next, the inner wall surface of the nozzle is maintained at the thermal equilibrium temperature. In addition, in the substrate processing step to be executed repeatedly after that, the inner wall surface of the nozzle is also maintained at the thermal equilibrium temperature. That is, the temperature of the inner wall surface of the nozzle is unchanged.

The high-temperature processing liquid supplied into the nozzle is brought into contact with the inner wall surface of the nozzle maintained at the thermal equilibrium temperature, and then discharged from the discharge port. Since the temperature of the inner wall surface of the nozzle is unchanged, the temperature of the processing liquid discharged from the discharge port can be uniformly maintained over plural substrate processing steps. Thereby, it is possible to reduce or prevent variations between the substrates.

In such a case, the nozzle may be provided movably between a processing position where the nozzle is to discharge the processing liquid to the substrate held by the substrate holding unit, and a retract position where the nozzle is retracted from the substrate holding unit. Further, the temperature changing unit may change a temperature of the nozzle in a state where the nozzle is disposed at the retract position.

With this configuration, the outer wall surface of the nozzle disposed at the retract position is heated or cooled by the temperature changing unit. With the nozzle movable between the processing position and the retract position, the nozzle is disposed at the retract position for a long period of time within a time period in which no processing liquid is supplied to the substrate. By effectively utilizing the time period in which no processing liquid is supplied to the substrate, a thick portion can be warmed up.

The substrate processing apparatus may further include an enclosing member for enclosing the nozzle disposed at the retract position. In this case, the temperature changing unit may be disposed on a side wall of the enclosing member.

With this configuration, by disposing the temperature changing unit on a wall surface of the enclosing member, the configuration in which the outer wall surface of the nozzle disposed at the retract position is heated or cooled by the temperature changing unit can be relatively simply realized.

In such a case, the plural nozzles may be provided, the enclosing member may be provided so as to be able to collectively enclose the plural nozzles respectively disposed at the retract position, and the plural temperature changing units may be provided. In this case, the temperature changing units may be provided corresponding to the nozzles, and each of the temperature changing units may individually change the temperature of the corresponding nozzle.

With this configuration, each of the temperature changing units individually changes the temperature of the outer wall surface of the corresponding nozzle. Thereby, the temperatures of the inner wall surfaces of the nozzles can be adjusted to temperatures different from each other. In a case where the plural nozzles are provided, the temperatures of the processing liquids discharged from the nozzles are sometimes different from each other. In such a case, the temperatures of the inner wall surfaces of the nozzles can also be set at the thermal equilibrium temperature.

The nozzle may include a communication passage communicating with the discharge port, and a body that partitions the communication passage. The processing liquid distributing member may include the body. In these cases, the outer wall surface of the processing liquid distributing member may include an outer wall surface of the body.

With this configuration, by heating or cooling the outer wall surface of the body by the temperature changing unit to change a temperature of the body, an inner wall surface of the body is maintained at the thermal equilibrium temperature in a state where no high-temperature processing liquid is supplied to the communication passage.

The thermal equilibrium temperature is a temperature of the inner wall surface of the body converging in a case where the substrate processing step is repeatedly and consecutively executed. By maintaining the inner wall surface of the body at the thermal equilibrium temperature in a state where no high-temperature processing liquid is supplied to the communication passage, in the substrate processing step to be executed next, the inner wall surface of the body is maintained at the thermal equilibrium temperature. In addition, in the substrate processing step to be executed repeatedly after that, the inner wall surface of the body is also maintained at the thermal equilibrium temperature. That is, the temperature of the inner wall surface of the body is unchanged.

The high-temperature processing liquid supplied to the communication passage is brought into contact with the inner wall surface of the body maintained at the thermal equilibrium temperature, and then discharged from the discharge port. Since the temperature of the inner wall surface of the body is unchanged, the temperature of the processing liquid discharged from the discharge port can be uniformly maintained over plural substrate processing steps. Thereby, variation in processing between the substrates can be reduced or prevented.

In this case, the communication passage may include plural branching passages, and each of the branching passages may have the discharge port. Further, the body may include a discharge port body that houses the plural branching passages.

With this configuration, the nozzle has the plural discharge ports. The high-temperature processing liquid supplied to each of the branching passages is brought into contact with the inner wall surface of the body maintained at the thermal equilibrium temperature, and then discharged from each of the discharge ports. Since the temperature of the inner wall surface of the body is unchanged, the temperature of the processing liquid discharged from each of the discharge ports can be uniformly maintained over plural substrate processing steps.

The body may be made by using a resin material. With this configuration, the body is made by using a heat-resistant resin material. The resin material is a material having large thermal capacity. Therefore, thermal conduction efficiency is poor. Since the body is made by using such a material, there is a problem that the temperature of the body is not easily changed. Therefore, in a case where plural substrate processing steps are repeatedly performed in a state where the inner wall surface of the body is at, for example, the room temperature, the temperature of the processing liquid discharged from the discharge port is raised with the number of times of the substrate processing step. Thereby, there is a problem that the temperatures of the processing liquids discharged from the discharge ports have variation between the plural substrate processing steps. As a result, there is a possibility that variations in processing between the substrates become obvious.

Meanwhile, with this configuration, in a state where no high-temperature processing liquid is supplied to the processing liquid distribution passage, the inner wall surface of the processing liquid distributing member is maintained at the thermal equilibrium temperature. Thereby, the temperature of the processing liquid discharged from the discharge port can be uniformly maintained over plural substrate processing steps. Therefore, even in a case where the body is made of the material having large thermal capacity, variation in processing between the substrates can be effectively reduced or prevented.

The resin material may include at least one of PCTFE, PTFE, and PFA. With this configuration, PCTFE, PTFE, and PFA can be shown as examples of materials of the body. In a case where these are materials of the body, there is a problem that the temperature of the body is not easily changed. However, even in a case where the body includes at least one of PCTFE, PTFE, and PFA, it is possible to effectively reduce or prevent variations in processing between the substrates.

The temperature changing unit may include a Peltier element. With this configuration, by the temperature changing unit including a Peltier element, the configuration in which the temperature changing unit heats the outer wall surface of the processing liquid distributing member and the configuration in which the temperature changing unit cools the outer wall surface of the processing liquid distributing member can be realized by a single member.

A second aspect of the present invention is to provide a substrate processing method including a substrate processing step of processing a substrate held by a substrate holding unit by supplying a high-temperature processing liquid having a higher temperature than a room temperature to a processing liquid distribution passage of a processing liquid distributing member and discharging the high-temperature processing liquid from a discharge port communicating with the processing liquid distribution passage, and an equilibrium temperature maintaining step of maintaining an inner wall surface of the processing liquid distributing member at a thermal equilibrium temperature by heating or cooling an outer wall surface of the processing liquid distributing member from the outside to change a temperature of the processing liquid distributing member in a state where the substrate processing step is not performed.

With this method, by heating or cooling the outer wall surface of the processing liquid distributing member to change the temperature of the processing liquid distributing member, in a state where no high-temperature processing liquid is supplied to the processing liquid distribution passage, the inner wall surface of the processing liquid distributing member is maintained at the thermal equilibrium temperature.

The thermal equilibrium temperature is the temperature of the inner wall surface converging in a case where the substrate processing step is repeatedly and consecutively executed. By maintaining the inner wall surface of the processing liquid distributing member at the thermal equilibrium temperature in a state where no high-temperature processing liquid is supplied to the processing liquid distribution passage, in the substrate processing step to be executed next, the inner wall surface of the processing liquid distributing member is maintained at the thermal equilibrium temperature. In addition, in the substrate processing step to be executed repeatedly after that, the inner wall surface of the processing liquid distributing member is also maintained at the thermal equilibrium temperature. That is, the temperature of the inner wall surface is unchanged.

The high-temperature processing liquid supplied to the processing liquid distribution passage is brought into contact with the inner wall surface of the processing liquid distributing member maintained at the thermal equilibrium temperature, and then discharged from the discharge port. Since the temperature of the inner wall surface is unchanged, the temperature of the processing liquid from the discharge port can be uniformly maintained over plural substrate processing steps. Thereby, variations in processing between the substrates can be reduced or prevented.

The equilibrium temperature maintaining step may include a step of maintaining the inner wall surface at the thermal equilibrium temperature and maintaining the outer wall surface at a predetermined temperature which is higher than the room temperature and lower than the thermal equilibrium temperature.

With this method, the outer wall surface is maintained at the predetermined temperature which is higher than the room temperature and lower than the thermal equilibrium temperature. Thereby, it is possible to reduce or prevent heat from entering and exiting the outer wall surface. In other words, it is possible to reduce or prevent heat from entering and exiting the processing liquid distributing member. Therefore, the inner wall surface can be continuously maintained in a state of thermal equilibrium.

The equilibrium temperature maintaining step may include a first heating step of heating the outer wall surface in order to raise the temperature of the outer wall surface to a higher temperature than the thermal equilibrium temperature, a cooling step of, subsequent to the first heating step, cooling the outer wall surface in order to lower the temperature of the outer wall surface to a lower temperature than the temperature of the processing liquid, and a second heating step of, next to the cooling step, heating the outer wall surface so that the inner wall surface of the processing liquid distributing member is maintained at the thermal equilibrium temperature and the temperature of the outer wall surface is maintained at the predetermined temperature.

With this method, first, by heating the outer wall surface, the temperature of the outer wall surface is raised to a higher temperature than the thermal equilibrium temperature. Next, by cooling the outer wall surface, the temperature of the outer wall surface is lowered to a lower temperature than the temperature of the processing liquid. Next, by heating the outer wall surface, the inner wall surface of the processing liquid distributing member is maintained at the thermal equilibrium temperature, and the temperature of the outer wall surface is maintained at the predetermined temperature. In this way, a state where the inner wall surface of the processing liquid distributing member is maintained at the thermal equilibrium temperature and the outer wall surface is maintained at the predetermined temperature which is higher than the room temperature and lower than the thermal equilibrium temperature can be realized by a relatively simple method.

The equilibrium temperature maintaining step may adjust the thermal equilibrium temperature in the equilibrium temperature maintaining step corresponding to the temperature of the processing liquid used in the substrate processing step which is executed after the equilibrium temperature maintaining step.

With this method, in a case where high-temperature processing liquids having temperatures different from each other are used in consecutively-executed two substrate processing steps, in the equilibrium temperature maintaining step executed between the two substrate processing steps, the inner wall surface of the processing liquid distributing member is adjusted to the thermal equilibrium temperature corresponding to the temperature of the processing liquid used in the substrate processing step to be executed after that. Thereby, in the substrate processing step to be executed after that, the inner wall surface of the processing liquid distributing member is continuously maintained at the thermal equilibrium temperature. Thereby, even in a case where the temperature of the high-temperature processing liquid to be discharged is changed midway, variations between the substrates can be reduced or prevented in the high-temperature processing after that.

The aforementioned and other objects, features, and effects of the present invention will be clarified by the following description of preferred embodiments, with reference to the accompanying drawings.

DETAILED DESCRIPTION OF PREFERRED EMBODIMENTS

Figure 1:
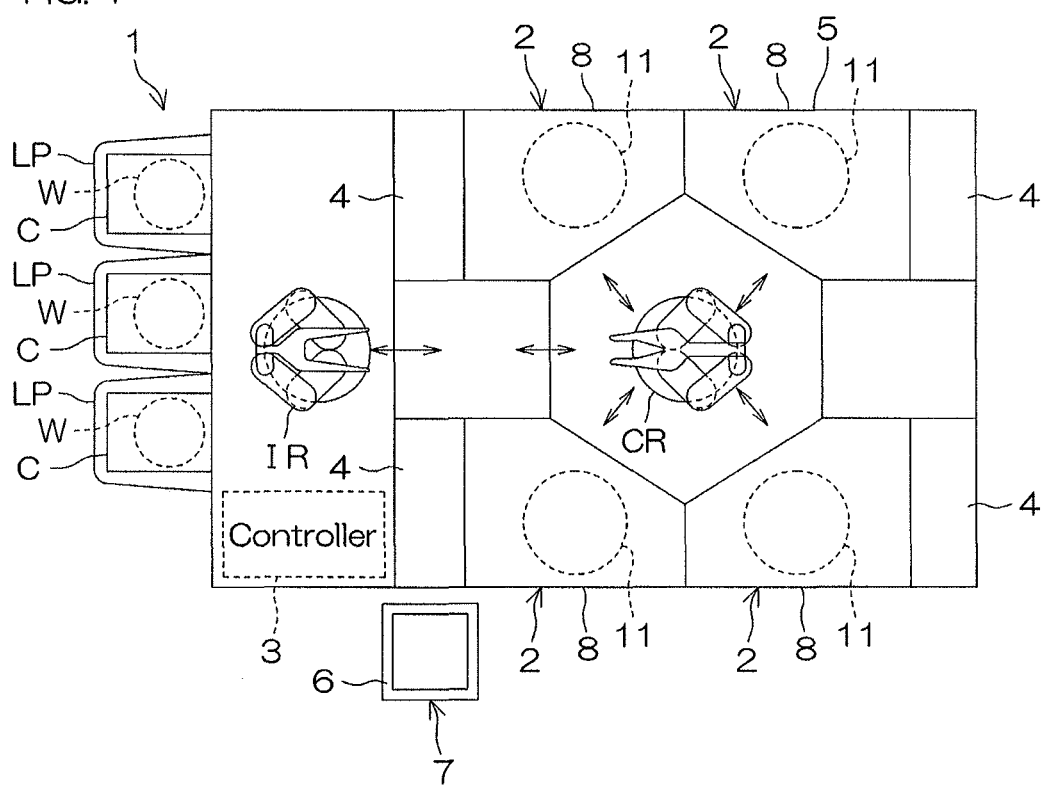
FIG. 1 is an illustrative plan view for describing an internal layout of a substrate processing apparatus according to a preferred embodiment of the present invention.

FIG. 1 is an illustrative plan view for describing an internal layout of a substrate processing apparatus 1 according to the preferred embodiment of the present invention. The substrate processing apparatus 1 is a single substrate processing type apparatus that processes one disk-shaped substrate W such as a semiconductor wafer one at a time.

The substrate processing apparatus 1 includes plural load ports LP in which plural substrate containers C that house substrates W are held, plural processing units 2 that process the substrates W transported from the plural load ports LP with a processing liquid such as a chemical liquid, transfer robots that transport the substrates W from the plural load ports LP to the plural processing units 2, and a controller 3 that controls the substrate processing apparatus 1. The transfer robots include an indexer robot IR that transports the substrates W on routes running between the load ports LP and the processing units 2, and a transfer robot CR that transports the substrates W on routes running between the indexer robot IR and the processing units 2.

The substrate processing apparatus 1 includes plural fluid boxes 4 that house chemical liquid supply valves 68 (see FIG. 6, etc.), etc. The processing units 2 and the fluid boxes 4 are disposed in frames 8 of the substrate processing apparatus 1, and covered with the frames 8 of the substrate processing apparatus 1. A storage box 7 that houses a chemical liquid tank 6, etc., that stores a processing liquid is disposed outside the frames 8 of the substrate processing apparatus 1 in the example of FIG. 1. However, the storage box may be housed in the frames 8. The storage box 7 may be a single box corresponding to the plural fluid boxes 4, or may be plural boxes provided in one-to-one correspondence to the fluid boxes 4.

Figure 2:
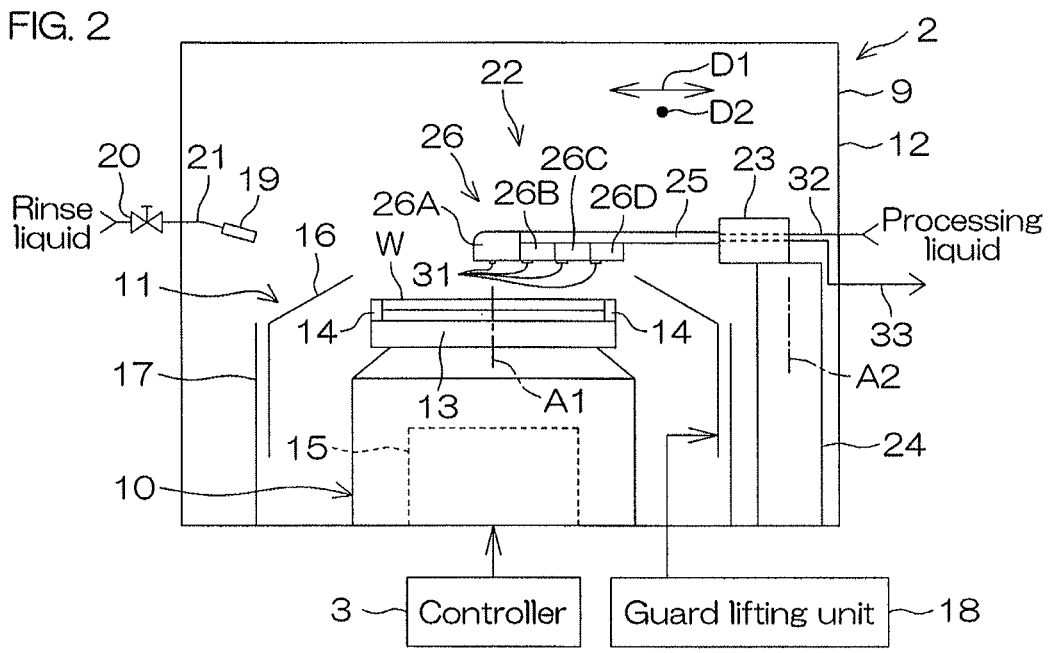
FIG. 2 is a schematic front view showing an interior of a processing unit provided in the substrate processing apparatus.
Figure 3:
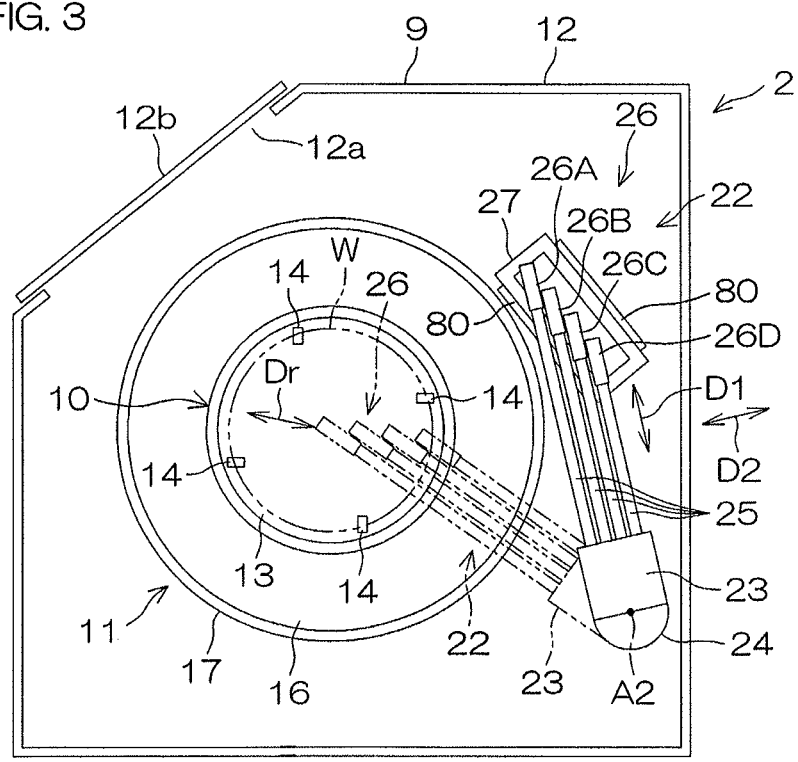
FIG. 3 is a schematic plan view showing the interior of the processing unit.

FIG. 2 is a schematic front view showing an interior of each of the processing units 2 provided in the substrate processing apparatus 1. FIG. 3 is a schematic plan view showing the interior of the processing unit 2 of FIG. 2.

The processing unit 2 includes a chamber 9, a spin chuck (substrate holding unit) 10 that horizontally holds a substrate W in the chamber 9 while rotating the substrate W about the vertical rotation axis A1 passing through a central portion of the substrate W, and a cylindrical cup 11 that receives the processing liquid discharged from the substrate W. The spin chuck 10 is an example of the substrate holding unit that horizontally holds the substrate W.

The chamber 9 includes a box-shaped partition wall 12 provided with a carry-in and carry-out port 12a through which the substrate W passes, and a shutter 12b that opens and closes the carry-in and carry-out port 12a. The shutter 12b can be moved with respect to the partition wall 12 between an open position where the carry-in and carry-out port 12a is opened and a close position where the carry-in and carry-out port 12a is closed (position shown in FIG. 3). The transfer robot (not shown) carries the substrate W in the chamber 9 through the carry-in and carry-out port 12a, and carries the substrate W out of the chamber 9 through the carry-in and carry-out port 12a.

The spin chuck 10 includes a disk-shaped spin base 13 held in a horizontal posture, plural chuck pins 14 that hold the substrate W in a horizontal posture above the spin base 13, and a spin motor 15 that rotates the substrate W about the rotation axis A1 by rotating the plural chuck pins 14. The spin chuck 10 is not limited to a clamping type chuck in which the plural chuck pins 14 are brought into contact with a peripheral end surface of the substrate W but may be a vacuum type chuck that horizontally holds the substrate W by absorbing a rear surface (lower surface) of the substrate W serving as a non-device-forming surface onto an upper surface of the spin base 13.

The cup 11 includes a cylindrical splash guard 16 that encloses the spin chuck 10 around the rotation axis A1, and a cylindrical outer wall surface 17 that encloses the splash guard 16 around the rotation axis A1. The processing unit 2 includes a guard lifting unit 18 that vertically elevates and lowers the splash guard 16 between an upper position where an upper end of the splash guard 16 is placed above a position where the substrate W is held by the spin chuck 10 (position shown in FIG. 2), and a lower position where the upper end of the splash guard 16 is placed below the position where the substrate W is held by the spin chuck 10.

The processing unit 2 includes a rinse liquid nozzle 19 that discharges a rinse liquid downward to an upper surface of the substrate W held by the spin chuck 10. The rinse liquid nozzle 19 is connected to a rinse liquid piping 21 in which a rinse liquid valve 20 is interposed. The processing unit 2 may include a nozzle movement unit that moves the rinse liquid nozzle 19 between a processing position and a retract position.

When the rinse liquid valve 20 is opened, the rinse liquid is supplied from the rinse liquid piping 21 to the rinse liquid nozzle 19, and discharged from the rinse liquid nozzle 19. The rinse liquid is, for example, pure water (deionized water). The rinse liquid is not limited to pure water but may be any of carbonated water, electrolyzed ion water, hydrogen water, ozone water, and aqueous hydrochloric acid solution of dilute concentration (for example, of about 10 to 100 ppm).

The processing unit 2 includes plural nozzles 22 that discharge the processing liquid downward, a holder 23 that holds the respective plural nozzles 22, and a nozzle movement unit 24 that moves the plural nozzles 22 between a processing position (position shown by a double chain line in FIG. 3) and a retract position (position shown by a solid line in FIG. 3) by moving the holder 23.

The processing liquid is, for example, a chemical liquid. The chemical liquid is, for example, an etching liquid. Specific examples of the etching liquid include DHF (diluted hydrofluoric acid), TMAH (tetramethylammonium hydroxide), dNH$_4$OH (diluted hydroxide ammonium), and SC-1 (mixture containing NH$_4$OH and H$_2$O$_2$). In addition, the processing liquid is, for example, a liquid containing at least one of sulfuric acid, acetic acid, nitric acid, hydrochloric acid, hydrofluoric acid, ammonia water, hydrogen peroxide water, organic acid (such as citric acid and oxalic acid), organic alkali excluding TMAH, a hydrophobic agent (such as TMS and HMDS), an organic solvent (such as IPA: isopropyl alcohol), a surfactant, and a corrosion inhibitor.

Each of the nozzles 22 is cantilevered by the holder 23, and includes an arm 25 extending in the horizontal longitudinal direction D1 from the holder 23, and a nozzle head 26 connected to a tip of the arm 25 (a first nozzle head 26A, a second nozzle head 26B, a third nozzle head 26C, or a fourth nozzle head 26D).

The plural arms 25 are placed side by side in the horizontal arrangement direction D2 which is orthogonal to the longitudinal direction D1 in the order from the first nozzle head 26A to the fourth nozzle head 26D. The plural arms 25 are disposed at the same height. An interval between the two arms 25 adjacent to each other in the arrangement direction D2 may be the same as any intervals between the other pairs of the arms or may be different from at least one of the above intervals. FIG. 3 shows an example in which the plural arms 25 are disposed at equal intervals.

Length of the plural arms 25 in the longitudinal direction D1 is shorter in the order from the first nozzle head 26A to the fourth nozzle head 26D. The plural nozzle heads 26 are displaced in the longitudinal direction D1 so that the nozzle heads are placed side by side in the order from the first nozzle head 26A to the fourth nozzle head 26D with respect to the longitudinal direction D1. The plural nozzle heads 26 are linearly placed in a plan view.

The nozzle movement unit 24 moves the plural nozzles 22 along an arc-shaped route passing through the substrate W in a plan view by turning the holder 23 about the nozzle turning axis A2 vertically extending around the cup 11. Thereby, the plural nozzles 22 are horizontally moved between the processing position (processing position P1 of FIG. 4) and the retract position (retract position P2 of FIG. 4). The processing unit further includes a cylindrical bottomed retract pot (enclosing member) 27 disposed below the retract position of the plural nozzles 22. The retract pot 27 is disposed around the cup 11 in a plan view.

The processing position is a position where the processing liquid discharged from the plural nozzles 22 lands on the upper surface of the substrate W. At the processing position, the nozzle heads 26 of the plural nozzles 22 overlap the substrate W in a plan view, and the plural nozzle heads 26 are placed side by side in the radial direction Dr in the order from the first nozzle head 26A to the fourth nozzle head 26D from the rotation axis A1 side in a plan view. At this time, the first nozzle head 26A overlaps the central portion of the substrate W in a plan view, and the fourth nozzle head 26D overlaps a peripheral edge portion of the substrate W in a plan view.

The retract position is a position where the plural nozzle heads 26 are retracted so that the plural nozzle heads 26 overlap the substrate W in a plan view. At the retract position, the plural nozzle heads 26 are placed on the outside of the cup 11 along an outer peripheral surface of the cup 11 (outer peripheral surface of the outer wall surface 17) in a plan view, and placed side by side in the circumferential direction (in the direction running about the rotation axis A1) in the order from the first nozzle head 26A to the fourth nozzle head 26D. The plural nozzle heads 26 are disposed to be away from the rotation axis A1 in the order from the first nozzle head 26A to the fourth nozzle head 26D.

In the following description, the ordinal number "first" and the reference sign "A" may be attached respectively to the beginning and the end of the names of arrangements corresponding to the first nozzle head 26A. For example, a chemical liquid supply flow passage 32 corresponding to the first nozzle head 26A may be described as the "first chemical liquid supply flow passage 32A." The same is applied to arrangements corresponding to the second nozzle head 26B to the fourth nozzle head 26D.

Figure 4:
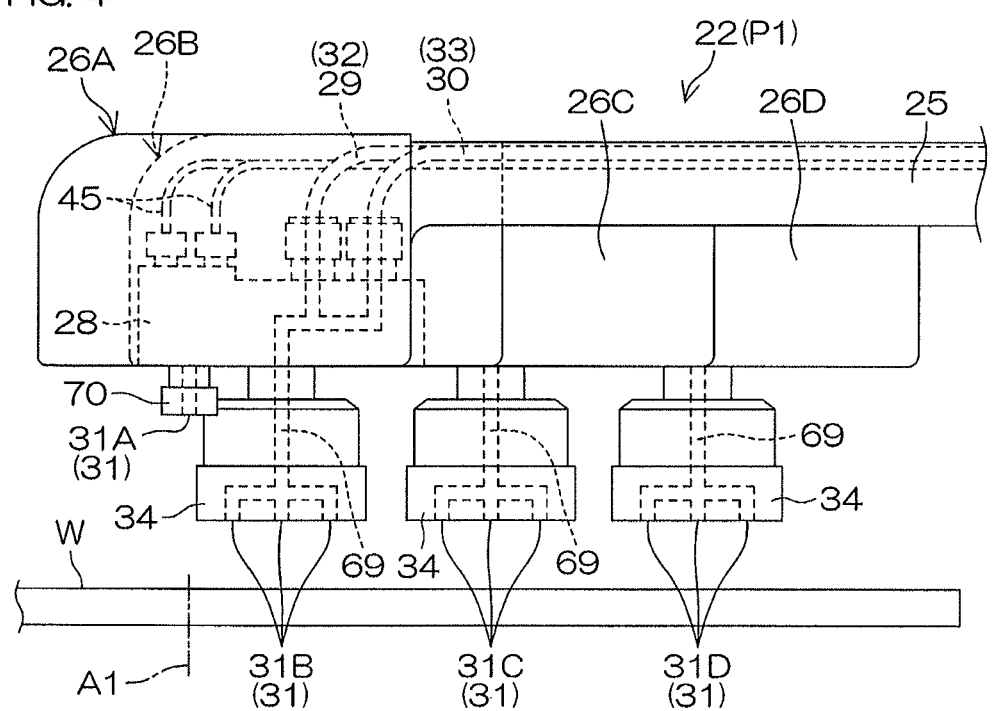
FIG. 4 is a schematic front view showing plural nozzles included in the processing unit.

FIG. 4 is a schematic front view showing the plural nozzles 22. FIG. 4 shows a state where the plural nozzles 22 are disposed at the processing position P1 set above the upper surface of the substrate W. In FIG. 4, an interior of only the second nozzle head 26B among the nozzle heads 26 of the plural nozzles 22 is described in detail. However, arrangement of interiors of the nozzle heads 26 excluding the second nozzle head 26B is the same as the second nozzle head 26B.

The first nozzle 22A has a single discharge port 31. Each of the second nozzle 22B, the third nozzle 22C, and the fourth nozzle 22D has three discharge ports 31. That is, the total number of the discharge ports 31 provided in the plural nozzles 22 is ten.

Each of the first to fourth nozzles 22A to 22D further includes a discharge valve 28. The discharge valve 28 is provided in the nozzle head 26. Two tubes 29, 30 are connected to each of the discharge valves 28. The tubes 29, 30 respectively define flow passages that guide the processing liquid.

A discharge port portion 70 is coupled to the discharge valve 28 of the first nozzle head 26A. Inside the discharge port portion 70, a single flow passage that guides the processing liquid is defined. The single flow passage of the discharge port portion 70 is open on a lower surface of the discharge port portion 70 to define a single discharge port 31 (31A).

A discharge port body 34 is coupled to the discharge valve 28 of each of the second nozzle head 26B to the fourth nozzle head 26D. The discharge port body 34 defines plural (for example, three) flow passages that guide the processing liquid. The plural flow passages of the discharge port body 34 of the second nozzle head 26B are open on a lower surface of the discharge port body 34 to define plural (for example, three) discharge ports 31 (31B). The plural flow passages of the discharge port body 34 of the third nozzle head 26C are open on a lower surface of the discharge port body 34 to define plural (for example, three) discharge ports 31 (31C). The plural flow passages of the discharge port body 34 of the fourth nozzle head 26D are open on a lower surface of the discharge port body 34 to define plural (for example, three) discharge ports 31 (31D).

The three discharge ports 31 (31B, 31C, 31D) provided in the discharge port body 34 include an inner side discharge port closest to the rotation axis A1 among the three discharge ports 31, an outside discharge port which is the most distant from the rotation axis A1 among the three discharge ports 31, and an intermediate discharge port disposed between the inner side discharge port and the outside discharge port. The plural discharge ports 31 are substantially linearly placed side by side in a plan view. An interval between the two adjacent discharge ports 31 may be the same as any intervals between the other pairs of the discharge ports or may be different from at least one of the above intervals. The plural discharge ports 31 may be disposed at two or more different heights or may be disposed at the same height.

Each of the discharge ports 31 discharges the processing liquid in the discharging direction which is perpendicular to the upper surface of the substrate W. The plural discharge ports 31 discharge the processing liquid toward plural liquid landing positions in the upper surface of the substrate W. The plural liquid landing positions are separate positions whose distances from the rotation axis A1 are different from each other.

In a state where the plural nozzle heads 26 are disposed at the processing position, the plural discharge ports 31 are respectively disposed at the plural positions whose distances from the rotation axis A1 (the shortest distances in a plan view) are different from each other. The plural discharge ports 31 are disposed in a row along the rotation radius direction of the substrate W in a plan view. The first discharge port 31A provided in the first nozzle head 26A is disposed to oppose a central portion of the upper surface of the substrate W. The second discharge ports 31B, the third discharge ports 31C, and the fourth discharge ports 31D provided in the nozzle heads 26 excluding the first nozzle head 26A are disposed to oppose not the central portion but the upper surface of the substrate W. In this state, the innermost discharge port (first discharge port 31A) closest to the rotation axis A1 among the plural discharge ports 31 is disposed above the central portion of the substrate W, and the outermost discharge port (fourth discharge port 31D) which is the most distant from the rotation axis A1 among the plural discharge ports 31 is disposed above the peripheral edge portion of the substrate W.

A flow passage running from the tube 29 to the discharge port 31 corresponds to part of the chemical liquid supply flow passage 32 (to be described later) that guides the processing liquid supplied from the chemical liquid tank 6 (see FIG. 1) toward the discharge port 31. A flow passage branching from the chemical liquid supply flow passage 32 in the discharge valve 28 and continuing to the tube 30 corresponds to part of a second return flow passage 33 (to be described later) that returns the processing liquid distributed through the chemical liquid supply flow passage 32 to the chemical liquid tank 6.

Figure 5:
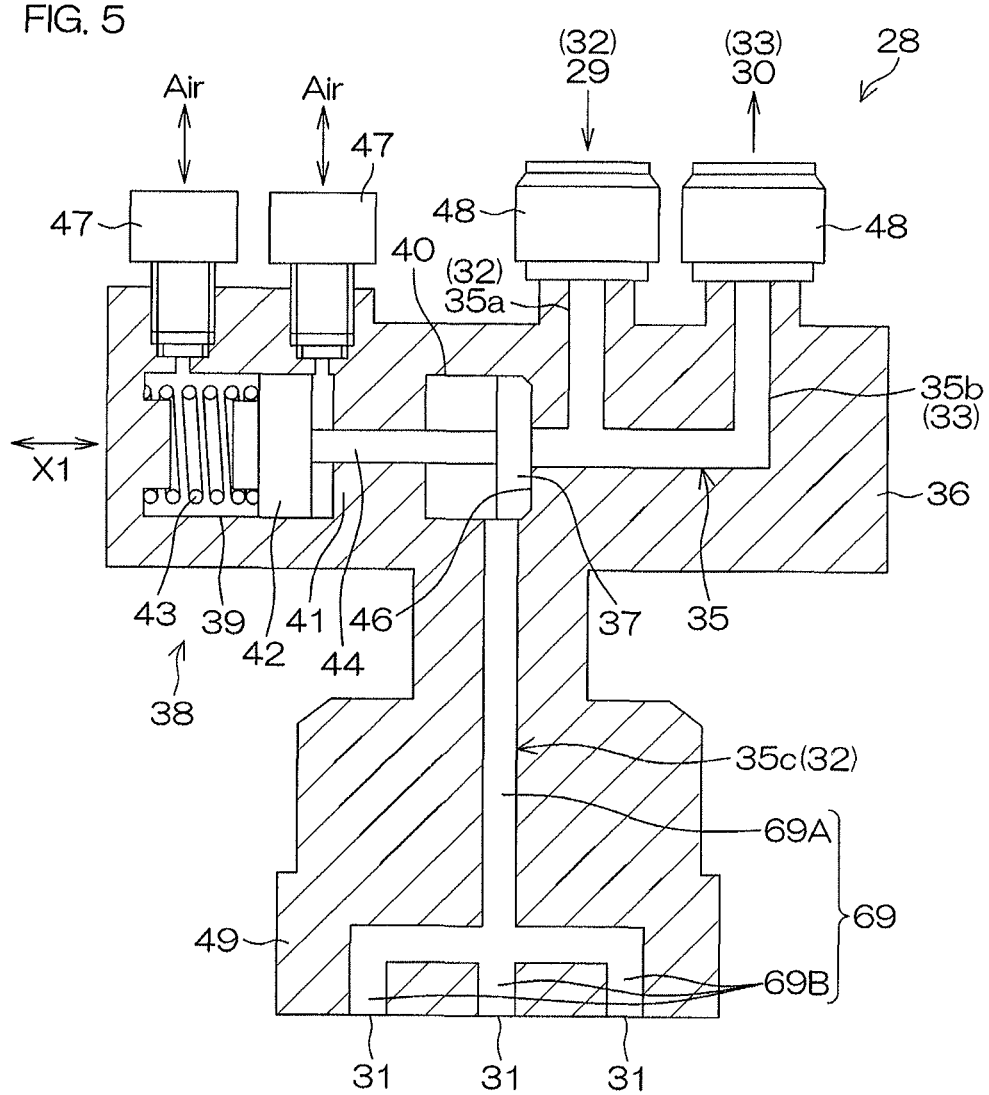
FIG. 5 is a sectional view showing an interior of an example of a discharge valve included in the nozzle.

FIG. 5 is a sectional view showing an interior of an example of the discharge valve 28.

The discharge valve 28 includes a main body 36 in which a flow passage 35 that guides the processing liquid is defined, a valve element 37 that opens and closes the flow passage 35, a pneumatic actuator 38 that brings the valve element 37 forward and backward in the axial direction X1 to open and close the flow passage 35, and the discharge ports 31.

The main body 36 includes a cylinder 39 forming the pneumatic actuator 38, a valve chamber 40 in which the valve element 37 is brought forward and backward, a flow passage 35a communicating with the tube 29 and running to the valve chamber 40, a flow passage 35b placed at a position on the upstream from the flow passage 35a with respect to the valve chamber 40 and connected to the flow passage 35a, the flow passage communicating with the tube 30, and a flow passage 35c running from the valve chamber 40 to the discharge ports 31. The cylinder 39 and the valve chamber 40 are placed side by side in the axial direction X1. The cylinder 39 and the valve chamber 40 are partitioned by a partition wall 41.

The flow passage 35c is inserted through an interior of the discharge port body 34, and a communication passage 69 communicating with the discharge ports 31 is defined. In the present preferred embodiment, the communication passage 69 includes a main communication passage 69A on the valve chamber 40 side, and plural branching passages 69B that connect the main communication passage 69A and the discharge ports 31.

The pneumatic actuator 38 includes the cylinder 39, a piston 42, a spring 43, and a rod 44. The cylinder 39 is divided by the piston 42 into a front chamber on the partition wall 41 side and a rear chamber on the opposite side in the axial direction X1 with respect to the piston 42. Joints 47 arranged to connect tubes (tubes 45 shown in FIG. 4) that transmit pneumatic pressure respectively separately to the front chamber and the rear chamber of the cylinder 39 are respectively connected to the main body 36. The piston 42 is brought forward and backward along the axial direction X1 in the cylinder 39 by the pneumatic pressure being transmitted to any one of the front chamber and the rear chamber of the cylinder 39 via the tubes 45 and the joints 47.

The spring 43 is inserted between the piston 42 and the main body 36 on the rear chamber side of the cylinder 39 to press the piston 42 in the direction of the partition wall 42.

A base portion of the rod 44 is joined to the piston 42, and a tip portion of the rod passes through the partition wall 41 and projects in the valve chamber 40. The valve element 37 is joined to the tip portion of the rod 44 projecting in the valve chamber 40. The valve element 37 is formed in a disk shape, and joined to the tip portion of the rod 44 so that the radial direction of the valve element is orthogonal to the axial direction X1. When the piston 42 is brought forward and backward in the axial direction X1 in the cylinder 39, the valve element 37 is brought forward and backward along the axial direction X1 via the rod 44 in the valve chamber 40.

The valve chamber 40 opposes the partition wall 41 and includes an annular valve seat surface 46 orthogonal to the axial direction X1, and the flow passage 35a is concentrically opened at a central position of the valve seat surface 46. The flow passage 35c is opened on the valve chamber 40 side, which is the side of the forward-backward direction (axial direction X1) of the valve element 37.

The tube 29 and the flow passage 35a are connected via a joint 48, and the tube 30 and the flow passage 35b are connected via another joint 48.

The main body 36 includes a cylindrical portion 49 in which the discharge ports 31 are defined in a tip, the cylindrical portion projecting downward from a lower surface of the nozzle head 26. In each of the nozzle heads 26 excluding the first nozzle head 26A, although not shown, the discharge port body 34 in which the plural flow passages that guide the processing liquid are defined is connected to the cylindrical portion 49, and the plural flow passages of the discharge port body 34 are opened on a lower surface, so that the plural discharge ports 31 are defined.

A portion in contact with the processing liquid (liquid contact portion) in the discharge valve 28 is made of a material having resistance against the processing liquid (for example, synthetic resin such as fluorine resin), or covered with a film made of a material having resistance against the processing liquid. Inner surfaces of the flow passage 35 and the valve chamber 40 or outer surfaces of the valve element 37 and the rod 44 are included in the liquid contact portion.

In a state where no pneumatic pressure acts on any of the front chamber and the rear chamber of the cylinder 39 and the pneumatic pressure actuator 38 is not activated, the piston 42 is pressed to a forward position, that is, as shown in FIG. 5, a position near the partition wall 41 side in the cylinder 38 by the spring 43 and thereby the valve element 37 is brought into contact with the valve seat surface 46 in the valve chamber 40, so that an opening of the flow passage 35a is closed. Therefore, the flow passage 35a and the flow passage 35c are isolated from each other, and the processing liquid supplied from the chemical liquid tank 6 through the tube 29 and the flow passage 35a is returned back to the chemical liquid tank 6 through the flow passage 35b and the tube 30 (discharge stop state).

In the discharge stop state, when the pneumatic pressure is transmitted to the front chamber of the cylinder 39 and the piston 42 is brought backward in the direction of the rear chamber of the cylinder 39 against the pressing force of the spring 43, the valve element 37 is separated from the valve seat surface 46 in the valve chamber 40, so that the opening of the flow passage 35a is released to the valve chamber 40. Therefore, the flow passage 35a and the flow passage 35c are connected via the valve chamber 40, and the processing liquid supplied from the chemical liquid tank 6 through the tube 29 and the flow passage 35a is discharged from the discharge ports 31 through the flow passage 35c (discharge state).

In the discharge state, when the transmission of the pneumatic pressure to the front chamber of the cylinder is stopped and instead, the pneumatic pressure is transmitted to the rear chamber of the cylinder 39 and the piston 42 is brought forward in the direction of the front chamber of the cylinder 39, that is, in the direction close to the partition wall 41 together with the pressing force of the spring 43, the valve element 37 is brought into contact with the valve seat surface 46 in the valve chamber 40, so that the opening of the flow passage 35a is closed. Therefore, the flow passage 35a and the flow passage 35c are isolated from each other, and the state is brought back to the discharge stop state where the processing liquid supplied from the chemical liquid tank 6 through the tube 29 and the flow passage 35a is returned back to the chemical liquid tank 6 (see FIG. 1) through the flow passage 35b and the tube 30.

The discharge valve 28 may be an electromagnetic valve or may be another valve.

Figure 6:
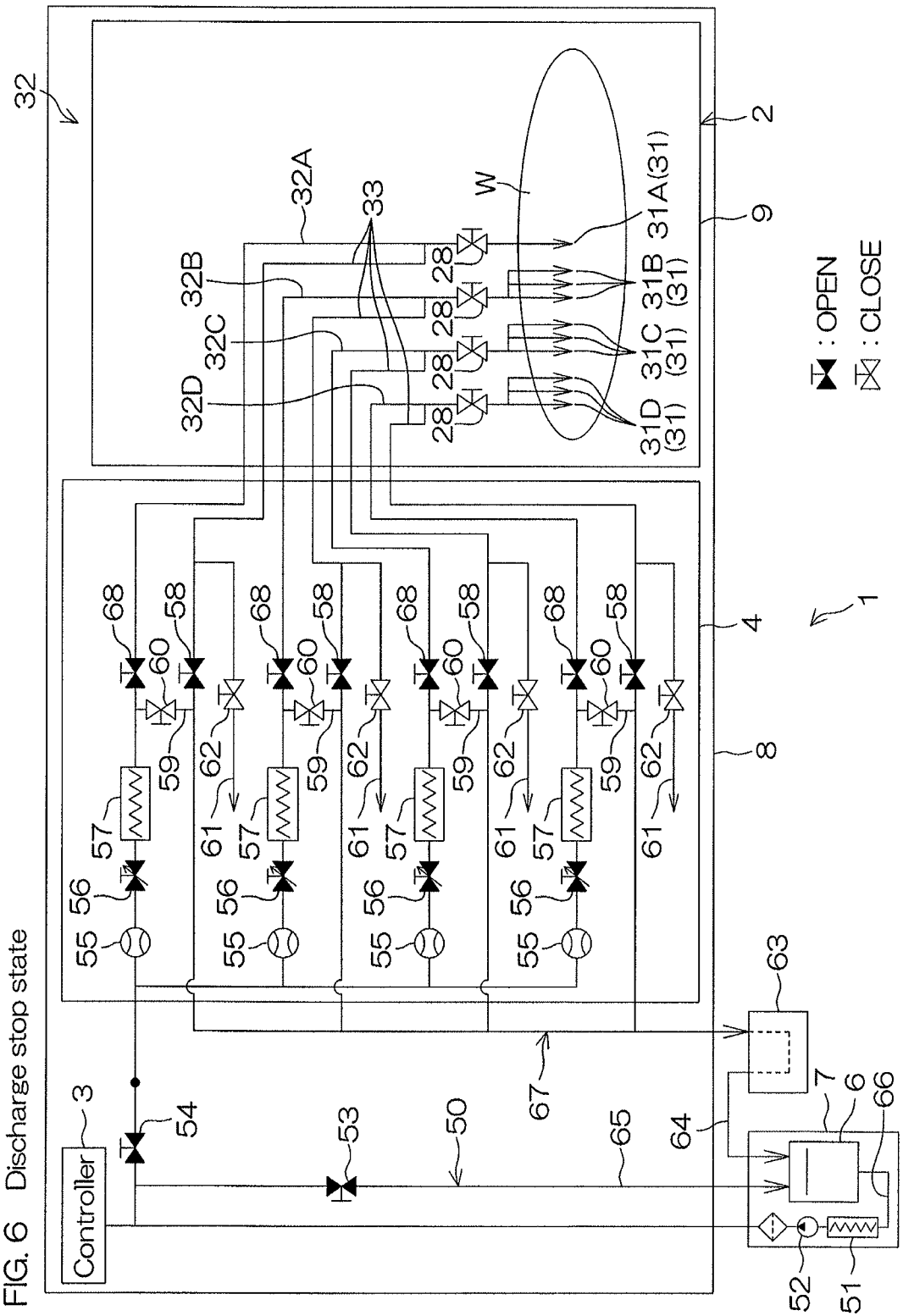
FIG. 6 is a schematic view showing a processing liquid supply system in a discharge stop state, the processing liquid supply system being included in the substrate processing apparatus.
Figure 7:
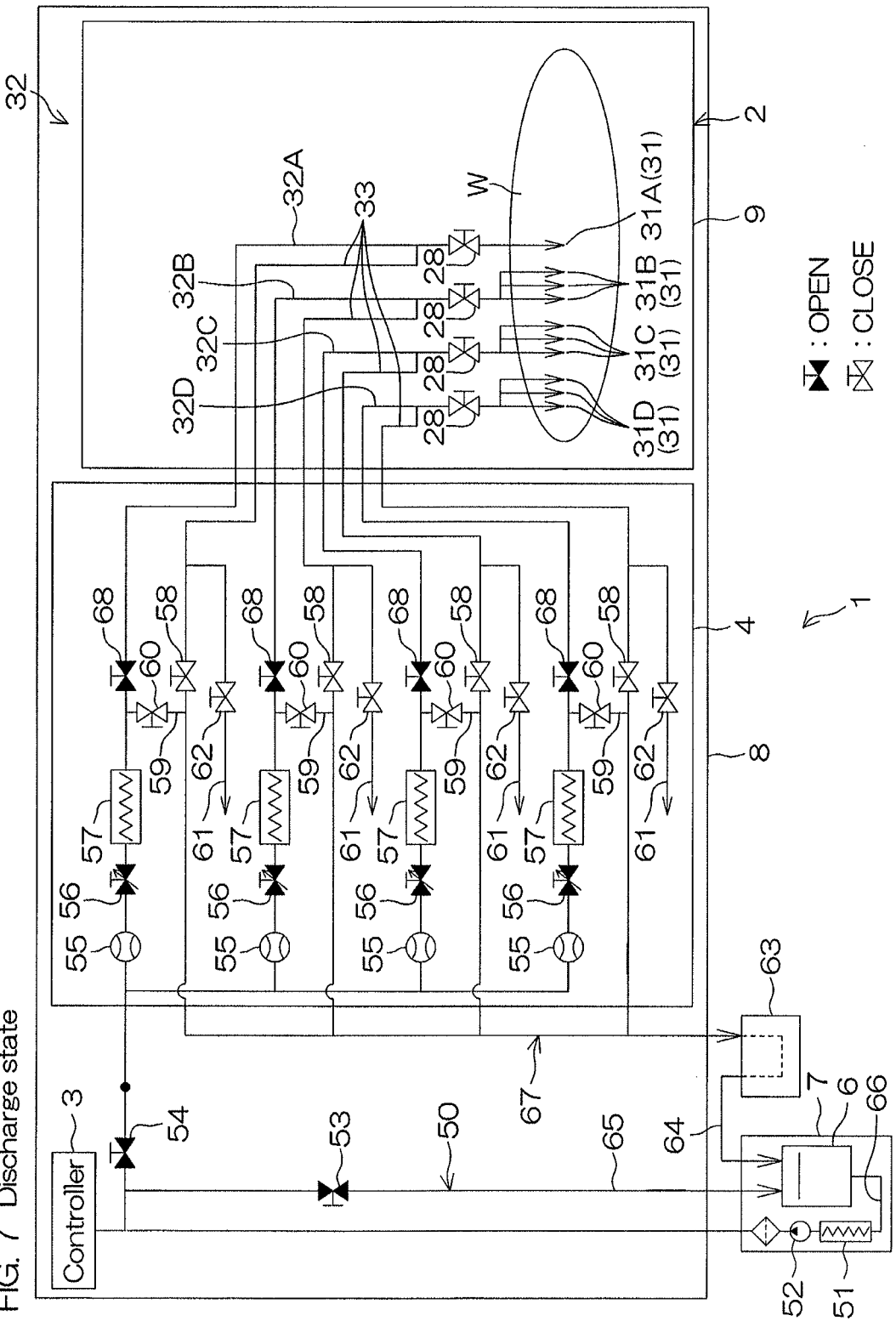
FIG. 7 is a schematic view showing the processing liquid supply system in a discharge state, the processing liquid supply system being included in the substrate processing apparatus.
Figure 8:
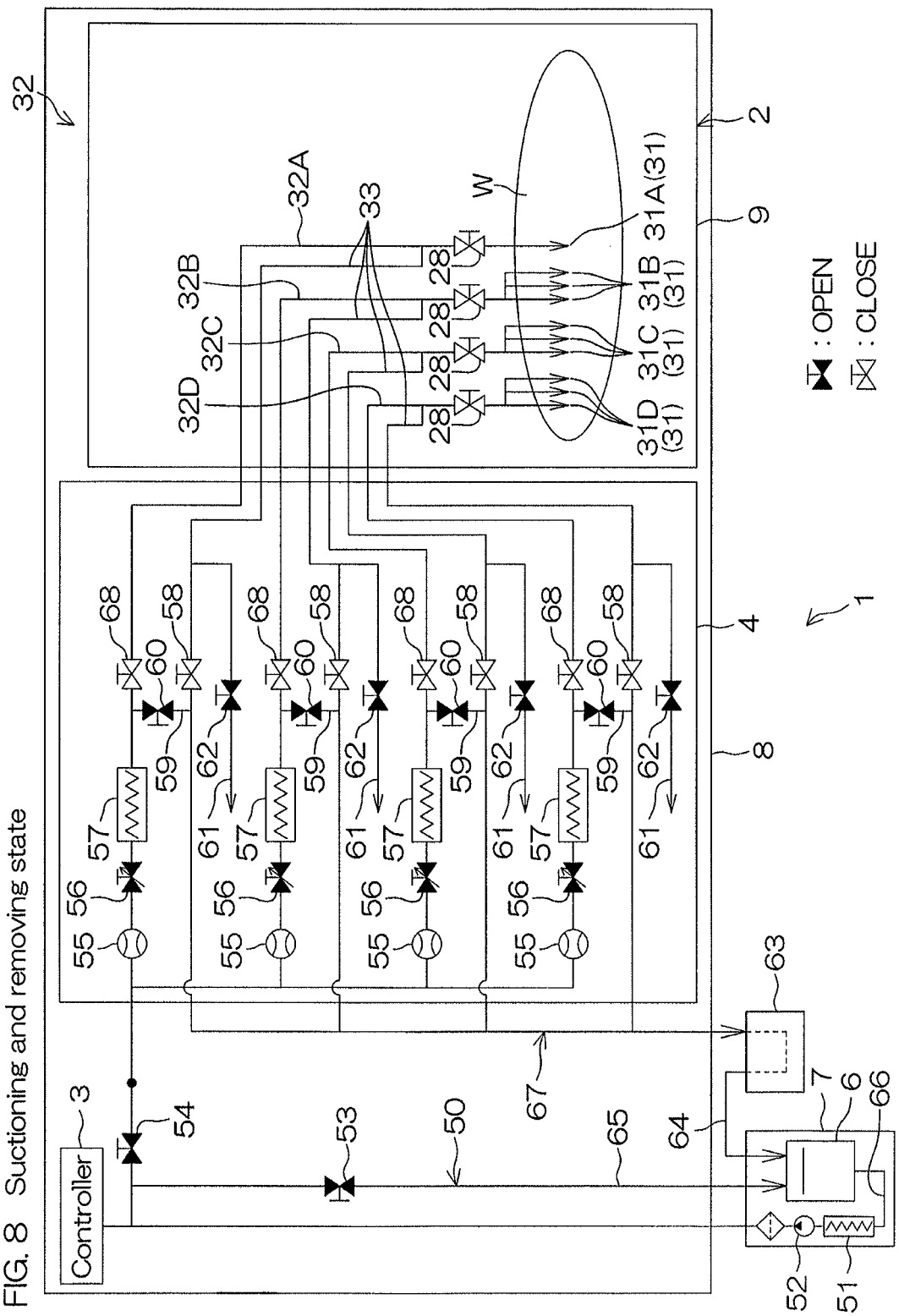
FIG. 8 is a schematic view showing the processing liquid supply system in a suctioning and removing state, the processing liquid supply system being included in the substrate processing apparatus.

FIGS. 6 to 8 are schematic views showing a processing liquid supply system included in the substrate processing apparatus 1. FIGS. 6, 7, and 8 show the discharge stop state, the discharge state, and a suctioning and removing state, respectively.

The processing liquid supply system includes the chemical liquid tank 6 that stores the chemical liquid, a chemical liquid flow passage 66 that guides the chemical liquid fed from the chemical liquid tank 6, a first circulation heater 51 that adjusts a temperature of the chemical liquid in the chemical liquid tank 6 by heating the chemical liquid flowing in the chemical liquid flow passage 66 at a temperature higher than a room temperature (RT: for example, about 23 to 25° C.), a pump 52 that feeds the chemical liquid in the chemical liquid tank 6 to the chemical liquid flow passage 66, and a first return flow passage 65 that returns the chemical liquid in the chemical liquid flow passage 66 to the chemical liquid tank 6. The chemical liquid tank 6, the chemical liquid flow passage 66, and the first return flow passage 65 are included in a first circulation flow passage 50 that circulates the processing liquid stored in the chemical liquid tank 6 and returns to the chemical liquid tank 6.

The processing liquid supply system includes a supply valve 54 that opens and closes the chemical liquid flow passage 66, a first return valve 53 that opens and closes the first circulation flow passage 50, and a chemical liquid supply flow passage 32 connected to the chemical liquid flow passage 66. The chemical liquid supply flow passage 32 includes plural chemical liquid supply flow passages 32 that guide the processing liquid supplied from the first circulation flow passage 50 toward the plural discharge ports 31 (including the first chemical liquid supply flow passage 32A, the second chemical liquid supply flow passage 32B, the third chemical liquid supply flow passage 32C, and the fourth chemical liquid supply flow passage 32D). The processing liquid supply system further includes plural flowmeters 55 that detect a flow rate of the processing liquid flowing in the plural chemical liquid supply flow passages 32, plural flow rate adjusting valves 56 that change the flow rate of the processing liquid flowing in the plural chemical liquid supply flow passages 32, plural second circulation heaters 57 that adjust the temperature of the chemical liquid in the chemical liquid tank 6 by heating the processing liquid flowing in the plural chemical liquid supply flow passages 32 at a temperature higher than the room temperature (for example, about 23 to 25° C.), the plural chemical liquid supply valves 68 that respectively open and close the plural chemical liquid supply flow passages 32, and the plural discharge valves 28 that respectively open and close the plural chemical liquid supply flow passages 32 in the chamber 9.

The processing liquid supply system further includes the plural second return flow passages 33 respectively connected to the plural chemical liquid supply flow passages 32 at positions on the upstream from the plural discharge valves 28 in the chamber 9, the second return flow passages that return the processing liquid distributed through the chemical liquid supply flow passages 32 back to the first circulation flow passage 50, and plural second return valves 58 that respectively open and close the plural second return flow passages 33.

The processing liquid supply system further includes plural bypass flow passages 59 connecting the plural chemical liquid supply flow passages 32 and the plural second return flow passages 33 respectively, plural bypass valves 60 that respectively open and close the plural bypass flow passages 59, plural suctioning flow passages 61 connected to the plural second return flow passages 33 at positions on the upstream of from connection positions to the bypass flow passages 59, and plural suctioning valves 62 that respectively open and close the plural suctioning flow passages 61. The plural bypass flow passages 59 are connected to a position upstream of the connection position with the second return flow passages 33 in the plural chemical liquid supply flow passages 32. Although not shown, a suctioning apparatus is connected to the downstream side of the suctioning flow passages 61. The bypass flow passages 59, the bypass valves 60, the suctioning flow passages 61, and the suctioning valves 62 are all provided in the fluid box 5.

The chemical liquid supply valves 68, the discharge valves 28, the second return valves 58, and the suctioning valves 62 are an example of a switching unit that switches the processing liquid supply system between the discharge state, the discharge stop state, and the suctioning and removing state. The bypass valves 60 are an example of an opening/closing unit that opens and closes the bypass flow passages 59.

The processing liquid supply system includes a cooler 63 that cools the processing liquid returned back from the plural second return flow passages 33, and a recovery flow passage 64 that guides the processing liquid from the cooler 63 to the chemical liquid tank 6. After the temperature of the processing liquid returned back from the plural second return flow passages 33 to the cooler 63 is brought close to a circulation temperature by the cooler 63, the processing liquid is guided to the chemical liquid tank 6 via the recovery flow passage 64. The cooler 63 may be a water cooling unit or an air cooling unit, or may be another cooling unit. The chemical liquid tank 6, the chemical liquid flow passage 66, the chemical liquid supply flow passages 32, the second return flow passages 33, and the recovery flow passage 64 are included in a second circulation flow passage (processing liquid supplying unit) 67 that circulates the processing liquid stored in the chemical liquid tank 6 and returns to the chemical liquid tank 6.

Next, with reference to FIG. 6, the processing liquid supply system in the discharge stop state where discharge of the processing liquid from the plural discharge ports 31 is stopped will be described. In FIG. 6, the opened valves are shown in black, and the closed valves are shown in white.

In the discharge stop state, the first return valve 53 is closed and the supply valve 54 is opened. Thereby, the chemical liquid circulated through the first circulation flow passage 50 flows through the plural chemical liquid supply flow passages 32 and is circulated through the second circulation flow passage 67. Specifically, the processing liquid supplied to the chemical liquid supply flow passages 32 is heated by the second circulation heaters 57, then fed to the connection positions to the second return flow passages 33 in the vicinity of the discharge ports 31 disposed in the chamber 9, and returned back from the connection positions to the chemical liquid tank 6 via the second return flow passages 33.

In the discharge stop state, by continuously circulating the processing liquid via the plural chemical liquid supply flow passages 32 and the second return flow passages 33 connected to the respective chemical liquid supply flow passages, the processing liquid in the respective chemical liquid supply flow passages 32 can be maintained at a predetermined high temperature to the connection positions to the second return flow passages 33 in the chamber 9 (that is, in the vicinity of the discharge ports 31).

Next, with reference to FIG. 7, the processing liquid supply system in the discharge state where the processing liquid is discharged from the plural discharge ports 31 will be described. In FIG. 7 as well, the opened valves are shown in black, and the closed valves are shown in white.

The processing liquid in the chemical liquid tank 6 is fed to the first circulation flow passage 50 by the pump 52. The processing liquid fed by the pump 52 is heated by the first circulation heater 51 and then flows from the first circulation flow passage 50 to the plural chemical liquid supply flow passages 32. The processing liquid supplied to the chemical liquid supply flow passages 32 is heated by the second circulation heaters 57 and then supplied to the plural discharge ports 31 disposed in the chamber 9.

The processing liquid supplied to the first chemical liquid supply flow passage 32A is supplied to the single first discharge port 31A provided in the first nozzle head 26A. The processing liquid supplied to the second chemical liquid supply flow passage 32B is supplied to the plural second discharge ports 31B provided in the second nozzle head 26B. The same as the second chemical liquid supply flow passage 32B is applied to the third chemical liquid supply flow passage 32C and the fourth chemical liquid supply flow passage 32D. Thereby the processing liquid is discharged from all the discharge ports 31.

In the discharge state, by supplying the processing liquid to plural different positions in the upper surface of the substrate W from the plural discharge ports 31, a decrease in uniformity of the temperature of the processing liquid can be reduced. In a case where the processing liquid discharged from the plural discharge ports 31 lands on the plural positions whose distances from the rotation axis are different while rotating the substrate W about the rotation axis, the processing liquid can be promptly delivered over the entire upper surface of the substrate W.

Next, with reference to FIG. 8, the processing liquid supply system in the suctioning and removing state where the processing liquid remaining in a region on the downstream from the connection positions to the second return flow passages 33 in the chemical liquid supply flow passages 32 will be described. In FIG. 8 as well, the opened valves are shown in black, and the closed valves are shown in white.

The processing liquid in the chemical liquid tank 6 is fed to the chemical liquid flow passage 66 by the pump 52. Part of the processing liquid fed by the pump 52 is heated by the first circulation heater 51 and then returned to the chemical liquid tank 6 via the first return flow passage 65. The remaining processing liquid fed by the pump 52 flows through the plural chemical liquid supply flow passages 32 from the first circulation flow passage 50. The processing liquid supplied to the chemical liquid supply flow passages 32 is heated by the second circulation heaters 57 and returned back to the chemical liquid tank 6 via the bypass flow passages 59.

The processing liquid remaining in the region on the downstream from the connection positions to the second return flow passages 33 in the chemical liquid supply flow passages 32 is suctioned and removed into the suctioning flow passages 61 by suctioning force transmitted from the suctioning flow passages 61 via the second return flow passages 33.

Figure 9:
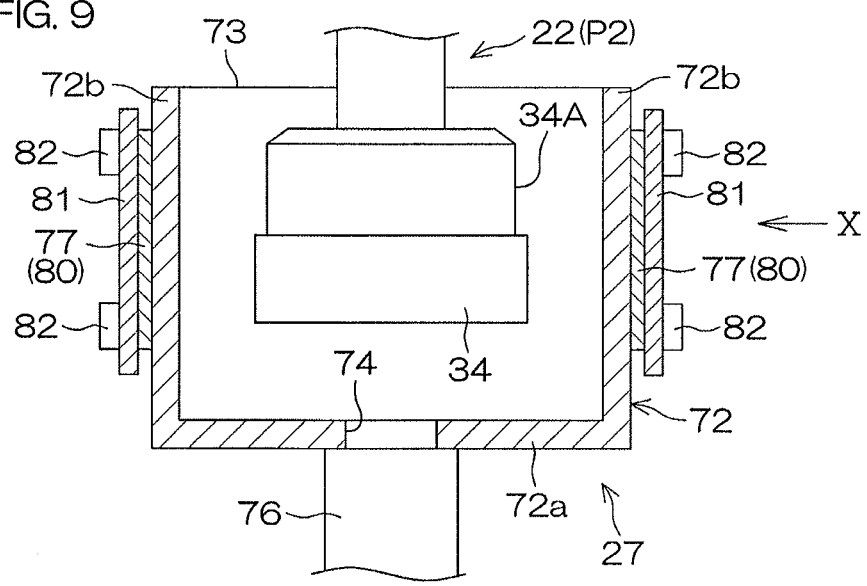
FIG. 9 is a sectional view showing a schematic configuration of a retract pot shown in FIG. 2.
Figure 10:
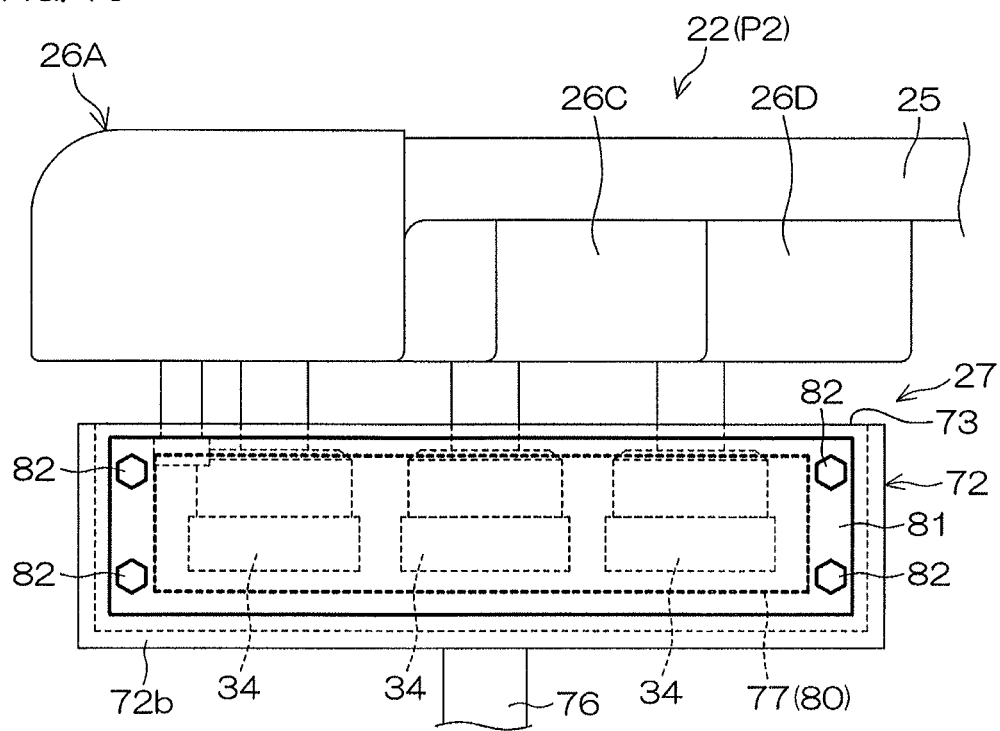
FIG. 10 is a view seen from an arrow X in FIG. 9.
Figure 11:
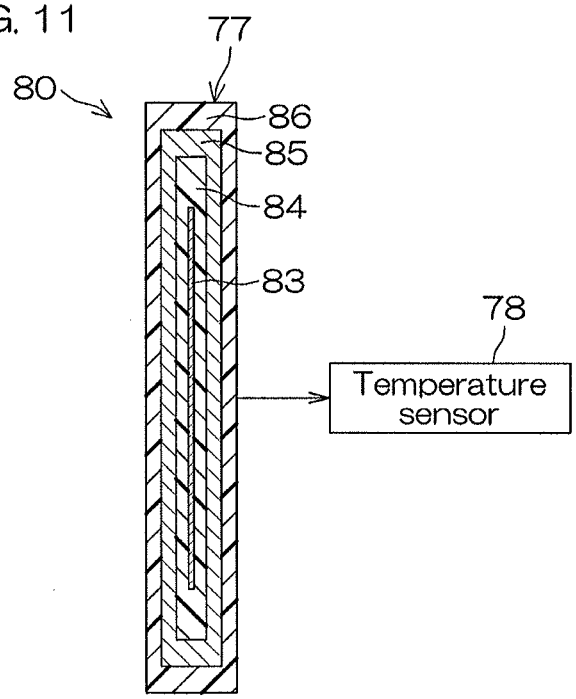
FIG. 11 is a sectional view of a temperature adjusting unit shown in FIG. 9.

FIG. 9 is a sectional view showing a schematic configuration of the retract pot 27. FIG. 10 is a view seen from an arrow X in FIG. 9. FIG. 11 is a sectional view of a temperature adjusting unit (temperature changing unit) 80.

The retract pot 27 includes, for example, a cylindrical bottomed housing 72 that partitions an inner space 71 of a substantially rectangular parallelepiped. The housing 72 has an insertion port 73 defined on an upper surface of the housing 72, and a discharging port 74 defined on a lower wall 72a of the housing 72. One end of a discharging piping 76 having the other end of which is connected to a drain processing facility out of the apparatus is connected to the discharging port 74 of the retract pot 27. FIGS. 9 and 10 show a state where the plural nozzles 22 are disposed at the retract position P2.

In a state where the plural nozzles 22 are disposed at the retract position P2, the discharge port bodies 34 are housed inside the retract pot 27. In the housing state, upper ends of the discharge port bodies 34 are positioned below the insertion port 73 of the retract pot 27. In other words, in a state where the nozzles 22 are disposed at the retract position P2, the discharge port bodies 34 are enclosed by the retract pot 27. Further, in the present preferred embodiment, the retract pot 27 collectively encloses the plural (for example, three) discharge port bodies 34.

The temperature adjusting units 80 are installed in the retract pot 27. Each of the temperature adjusting units 80 includes a temperature adjuster 77 in which a heat source 83 such as a Peltier element is built, and a temperature sensor 78 arranged to detect a surface temperature of the temperature adjuster 77. In the present preferred embodiment, a pair of temperature adjusting units 80 are provided.

The temperature adjusters 77 are respectively disposed on outside surfaces of both side walls 72b of the housing 72 of the retract pot 27. Each of the temperature adjusters 77 is fixed to the side wall 72b of the housing 72 by a fixing plate 81 made by an insulating material and bolts 82.

As shown in FIG. 11, the temperature adjuster 77 is formed in a rectangular sheet. The temperature adjuster 77 includes the film-shaped heat source 83, an insulating layer 84 that surrounds a periphery of the heat source 83, a thermal diffusion body 85 that surrounds a periphery of the insulating layer 84, and an insulating body 86 that surrounds a periphery of the thermal diffusion body 85. As the heat source 83, for example, a configuration in which heat generation and heat absorption can be performed is adopted. Such a heat source 83 includes a Peltier element. As the temperature sensor 78, for example, a thermocouple is adopted.

When electric power is supplied to the heat sources 83 of the temperature adjusters 77, the heat sources 83 generate heat or absorb heat, so that a temperature of front surfaces of the temperature adjusters 77 is raised or lowered. By raising or lowering the temperature of the front surfaces of the temperature adjusters 77 in a state where the nozzles 22 are disposed at the retract position P2, outer wall surfaces 34A of the discharge port bodies 34 are heated or cooled. Since the heat sources 83 include a Peltier element, a configuration in which the temperature adjusting units 80 heat the outer wall surfaces 34A of the discharge port bodies 34 and a configuration in which the temperature adjusting units 80 cool the outer wall surfaces 34A of the discharge port bodies 34 can be realized by a single member.

Figure 12:
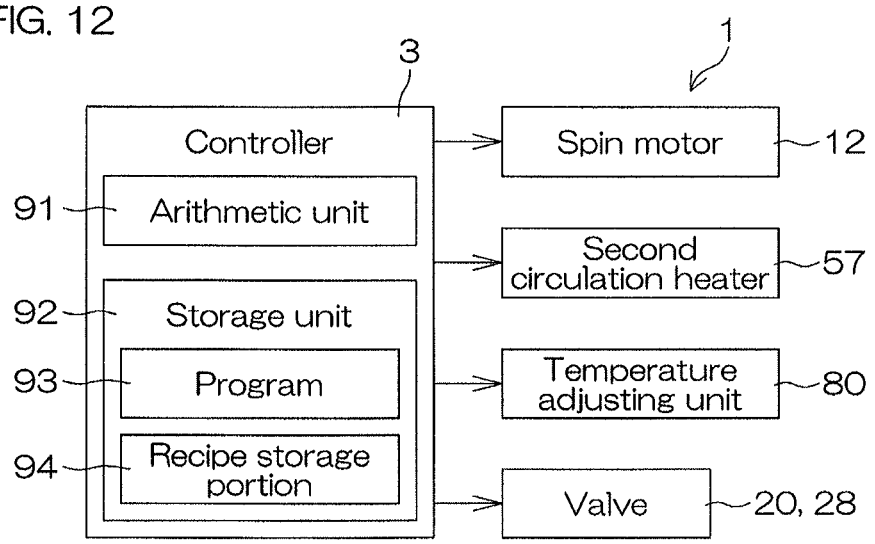
FIG. 12 is a block diagram for describing an electrical configuration of a main portion of the substrate processing apparatus.

FIG. 12 is a block diagram for describing an electrical configuration of a main portion of the substrate processing apparatus 1.

The controller 3 is arranged using, for example, a microcomputer. The controller 3 has an arithmetic unit 91 such as a CPU, etc., a storage unit 92 such as a fixed memory device (not shown), a hard disk drive, etc., and an input/output unit (not shown). A program 93 executed by the arithmetic unit 91 is stored in the storage unit 92.

The storage unit 92 includes a recipe storage portion 94 that stores recipes regulating contents of the processing to be performed on the substrate W. The recipe storage portion 94 is a non-volatile memory in which data is electrically re-writable. Process recipes (not shown) regulating the contents of the processing to be performed on the substrate W (including the procedures and conditions, the same is applied to the following description) are stored in the recipe storage portion 94.

The predetermined number of (for example, twenty-five) substrates W serving as a single lot are carried in the substrate processing apparatus 1 in a state where the substrates are collectively housed in each of the substrate containers C (see FIG. 1). In the substrate processing apparatus 1, a process job is associated with each of the substrate containers C. When the substrate container C is mounted on the load port LP (see FIG. 1) of the substrate processing apparatus 1, substrate information indicating information of the lot included in the substrate container C is sent from a host computer to the controller 3. The host computer is a computer that controls plural substrate processing apparatuses installed in a semiconductor manufacturing plant together. In the controller 3, based on the substrate information (process job) sent from the host computer, a process recipe for that lot is read out from the recipe storage portion 94. By the controller 3 repeatedly executing control according to the process recipe, the substrates W housed in a single substrate container C are consecutively carried in the processing unit 2 one after another, and receive substrate processing in the processing unit 2. When the control in conjunction with the process recipe is executed for the predetermined number of times which is equal to the number of the substrates housed in the substrate container C, the processing is executed for the substrates housed in another substrate container C which is carried subsequent to the above substrate container C.

Further, the controller 3 controls operations of the spin motor 15, the second circulation heaters 57, the temperature adjusting units 80, etc., in conjunction with the contents of the program 93 stored in the storage unit 92. The controller 3 also controls the discharge valves 28, the rinse liquid valve 20, etc.

Figure 13:
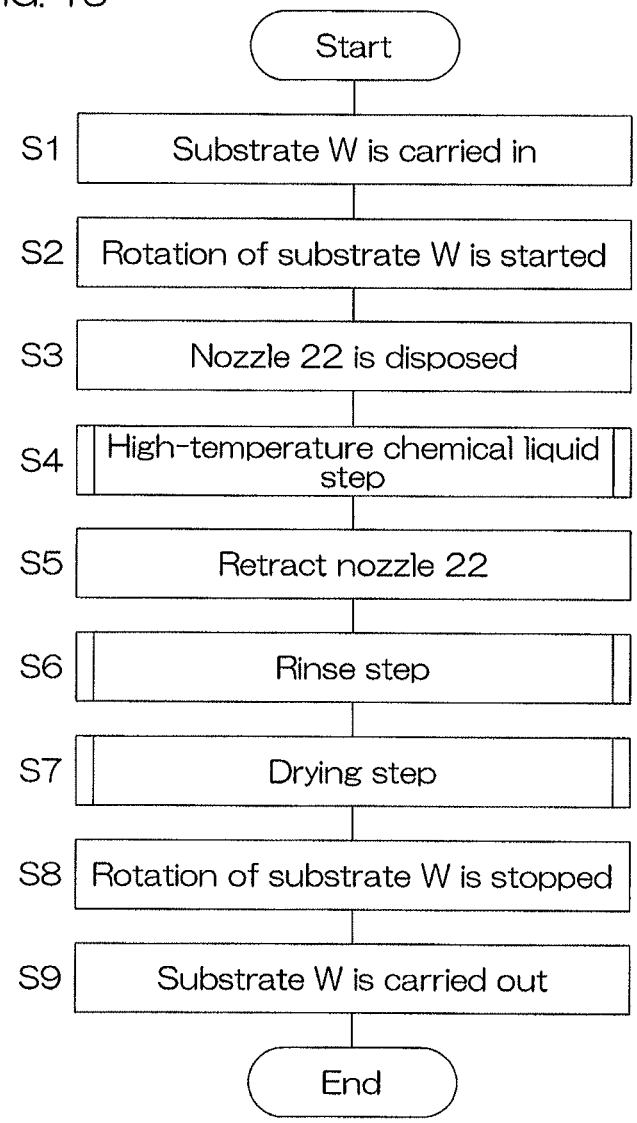
FIG. 13 is a flowchart for describing a processing example of processing performed by the processing unit.
Figure 14:
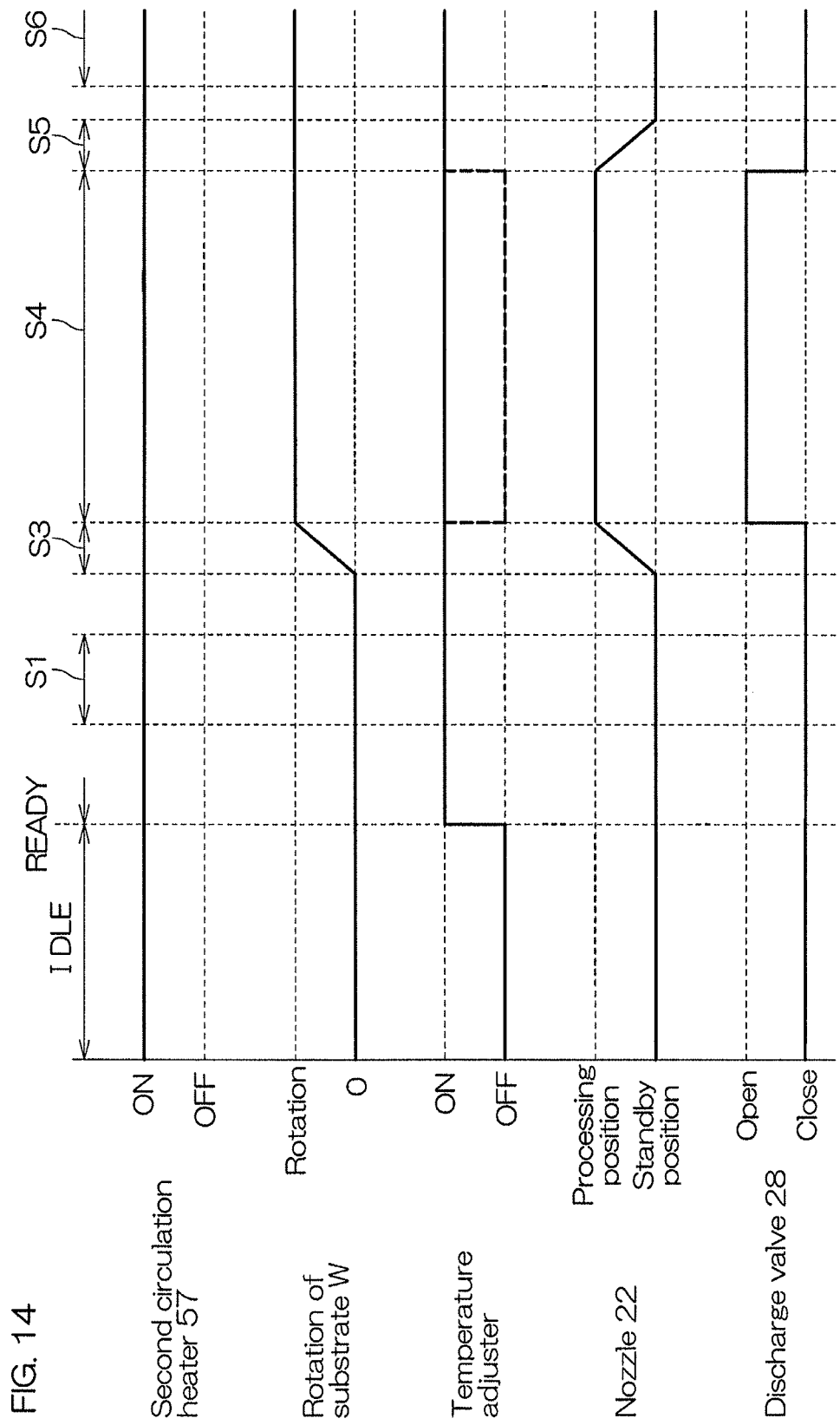
FIG. 14 is a time chart for describing main control contents of a controller in the processing example.

FIG. 13 is a flowchart for describing a processing example of the processing performed by the processing unit 2. FIG. 14 is a time chart for describing main control contents of the controller 3 in the processing example.

The processing example will be described with reference to FIGS. 1 to 14. The processing example is a processing example in which etching processing is performed on the substrate W by using an etching liquid as a high-temperature chemical liquid.

Immediately after the substrate processing apparatus 1 (that is, the processing liquid supply system) is started up, the controller 3 starts activating the pump 52, and also starts activating the first and second circulation heaters 51, 57. After that, the controller 3 closes the first return valve 53 and also closes the supply valve 54. In this state, the chemical liquid is circulated through the second circulation flow passage 67 (the processing liquid supply system is brought into the discharge stop state shown in FIG. 6). By always citing an output value of a temperature gauge (not shown), the controller 3 monitors the temperature of the chemical liquid circulated in the second circulation flow passage 67. The chemical liquid in the second circulation flow passage 67 is increased targeting a preliminarily fixed high-temperature processing temperature (for example, about 82° C. in the present processing example), and after reaching the processing temperature, maintained at the high-temperature processing temperature.

Immediately after the substrate processing apparatus 1 is started up, the controller 3 also controls the temperature adjusting units 80 to start heating the outer wall surfaces 34A of the discharge port bodies 34 by the temperature adjusting units 80.

After that, until the substrate W is carried in, the substrate processing apparatus 1 is in an IDLE state (standby state).

When the substrate container C that houses unprocessed substrates W is mounted on the load port LP (READY), the substrate W to be processed is taken out from the substrate container C by the indexer robot IR. The taken-out substrate W is delivered to the transfer robot CR, and carried in the chamber 9 by the transfer robot CR (Step S1 of FIG. 13). Specifically, by a hand H of the transfer robot CR holding the substrate W coming into the chamber 9, the substrate W is delivered to the spin chuck 10 in a state where the front surface (surface to be etched) is directed upward. After that, the substrate W is held by the spin chuck 10 and the hand H is retracted out of the chamber 9. In a state before the substrate W is carried in, the nozzles 22 are disposed at the retract position P2.

After the substrate W is held by the spin chuck 10, the controller 3 controls the spin motor 15 to start rotation of the substrate W (Step S2 of FIG. 13). Rotation speed of the substrate W is raised up to liquid processing speed (predetermined speed from about 300 rpm to about 1,000 rpm).

Next, a high-temperature chemical liquid step of supplying the chemical liquid to the substrate W (Step S4 of FIG. 13) is performed. Specifically, the controller 3 controls the nozzle movement unit 24 to dispose the nozzles 22 disposed at the retract position P2 (that is, housed in the retract pot 27) at the processing position P1 (see FIG. 4) (Step S3 of FIG.

13). After the nozzles 22 are disposed at the processing position P1, the controller 3 opens the discharge valves 28. Thereby, the chemical liquid is discharged from the nozzles 22 toward the upper surface of the rotating substrate W. The chemical liquid discharged from the nozzles 22 is supplied to the upper surface of the substrate W (S4). Since the plural discharge ports 31 are placed side by side along the rotation radius direction of the substrate W (discharged from a number of points), the chemical liquid can be delivered over the entire upper surface of the substrate W. Thereby, chemical liquid processing (for example, etching processing) can be performed uniformly to the upper surface of the substrate W. When a preliminarily fixed time period elapses after start of discharge of the chemical liquid, the controller 3 closes the discharge valves 28 to stop the discharge of the chemical liquid from the nozzles 22. Thereby, the high-temperature chemical liquid step (S4) is ended.

After the stop of the discharge of the chemical liquid, the controller 3 controls the nozzle movement unit 24 to retract the nozzles 22 from the processing position P1 to the retract position P2 (Step S5 of FIG. 13).

After the end of the high-temperature chemical liquid step (S4), a rinse process of supplying the rinse liquid to the substrate W (Step S6 of FIG. 13) is performed. Specifically, the controller 3 opens the rinse liquid valve 20 to start discharge of the rinse liquid from the rinse liquid nozzle 19. The rinse liquid discharged from the rinse liquid nozzle 19 is supplied to the upper surface of the rotating substrate W. By the rinse liquid, the chemical liquid attached onto the upper surface of the substrate W is washed away. When a preliminarily fixed time period elapses after the start of the discharge of the rinse liquid, the controller 3 closes the rinse liquid valve 20 to stop the discharge of the rinse liquid from the rinse liquid nozzle 19. Thereby, the rinse process (S6) is ended.

Next, the controller 3 controls the spin motor 15 to accelerate the substrate W up to drying rotation speed (for example, several thousand rpm) which is greater than the rotation speed in Steps S4, S5, and rotate the substrate W at the drying rotation speed. Thereby, large centrifugal force is applied to the liquid on the substrate W, and the liquid attached to the peripheral edge portion of the substrate W is shaken off to a periphery of the substrate W. In this way, the liquid is removed from the peripheral edge portion of the substrate W, and the peripheral edge portion of the substrate W is dried (S7 of FIG. 13: drying process).

When the drying process (S7) is performed over a preliminarily fixed time period, the controller 3 controls the spin motor 15 to stop rotation of the spin chuck 10 (rotation of the substrate W) (Step S8 of FIG. 13).

After the stop of the rotation of the substrate W, holding of the substrate W by the plural chuck pins 14 is canceled. After that, the controller 3 carries the processed substrate W out from an interior of the chamber 9 by the transfer robot as well as the carry-in of the substrate W (Step S9 of FIG. 13).

After that, the next substrate W is consecutively carried in, and the processes of Steps S1 to S9 are performed on the substrate W.

The chemical liquid is supplied to the communication passage 69 of the discharge port body 34. At this time, a temperature Tc of the chemical liquid supplied to the communication passage 69 (see FIG. 15) is, for example, about 82° C., and the chemical liquid of the temperature is discharged from the discharge ports 31.

Excluding the high-temperature chemical liquid step (S4), the nozzles 22 are disposed at the retract position P2. In a state where the nozzles 22 are disposed at the retract position P2, the inner wall surface 34B of the discharge port body 34 is heated by the temperature adjusting units 80.

Figure 15:
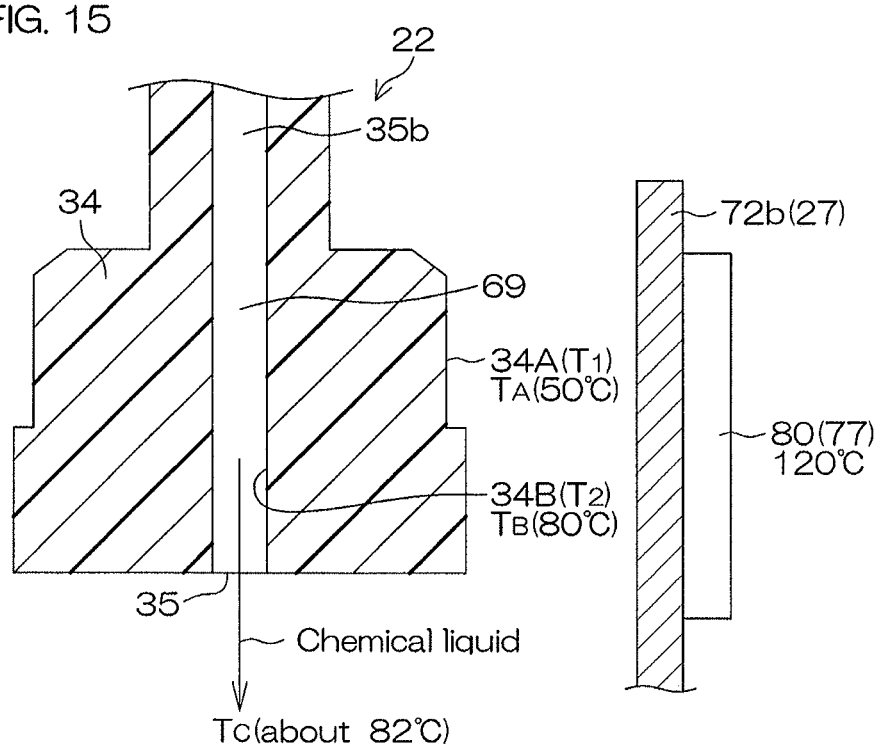
FIG. 15 is a schematic view showing a state where the temperature adjusting unit is heating an outer wall surface of a discharge port body included in the nozzle.

FIG. 15 is a schematic view showing a state where the temperature adjusting unit 80 is heating the outer wall surface 34A of the discharge port body 34.

The discharge port body 34 is made by using a heat-resistant resin material. As such a resin material, PCTFE (polychlorotrifluoroethylene), PTFE (polytetrafluoroethylene), and PFA (perfluoroalkoxyethylene) can be shown as examples. PCTFE, PTFE, and PFA are materials respectively having large thermal capacity. Therefore, thermal conduction efficiency is poor. The discharge port body 34 is provided to be thick, and thickness of the discharge port body is large. In the present preferred embodiment, the thickness of the discharge port body 34 (that is, a distance between the outer wall surface 34A and the inner wall surface 34B) is provided as large as about 10 millimeters.

In this state, the controller 3 controls the temperature adjusting units 80 to maintain a control temperature of the temperature adjusting units 80 (that is, the surface temperature of the temperature adjuster 77) at a high temperature (for example, about 120° C.). In this state, the outer wall surface 34A of the discharge port body 34 is warmed up and a temperature $T_1$ of the outer wall surface 34A reaches a low temperature $T_A$ (for example, about 50° C.). The low temperature $T_A$ is a temperature at which in a heated state from the temperature adjusting units 80, the outer wall surface 34A of the discharge port body 34 is maintained in a state of thermal equilibrium with the ambient atmosphere. Meanwhile, a temperature $T_2$ of the inner wall surface 34B is maintained at a thermal equilibrium temperature $T_B$ (for example, about 80° C.) which is a thermal equilibrium temperature of the inner wall surface 34B. The thermal equilibrium temperature of the inner wall surface 34B is a temperature of the inner wall surface 34B in a non-distribution state of the chemical liquid, converging in a case where the plural high-temperature chemical liquid steps (S4 of FIG. 13) are repeatedly and consecutively executed. The thermal equilibrium temperature $T_B$ of the inner wall surface 34B is determined by an experiment, etc., which is conducted in advance.

That is, the state shown in FIG. 15 is a state where the inner wall surface 34B of the discharge port body 34 is maintained at the thermal equilibrium temperature $T_B$ and the outer wall surface of the discharge port body 34 is maintained at the low temperature $T_A$. In such a state, it is possible to prevent heat from entering and exiting the discharge port body 34 on the outer wall surface 34A of the discharge port body 34. Therefore, the inner wall surface 34B of the discharge port body 34 can be continuously maintained in a state of thermal equilibrium. Such a state is realized by a thermal equilibrium temperature adjusting step performed at the beginning of heating by the temperature adjusting units 80 (at the beginning of a thermal equilibrium temperature maintaining step).

Figure 16:
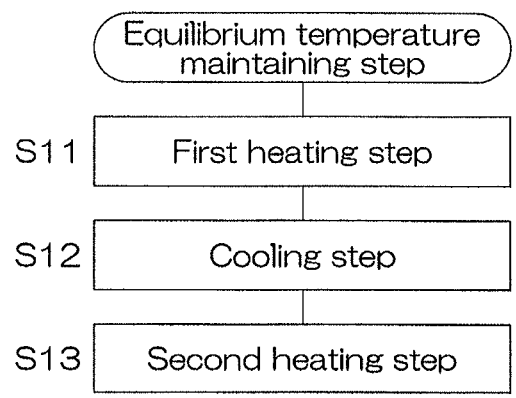
FIG. 16 is a flowchart showing contents of an equilibrium temperature adjusting step executed at the beginning of heating by the temperature adjusting units.
Figure 17:
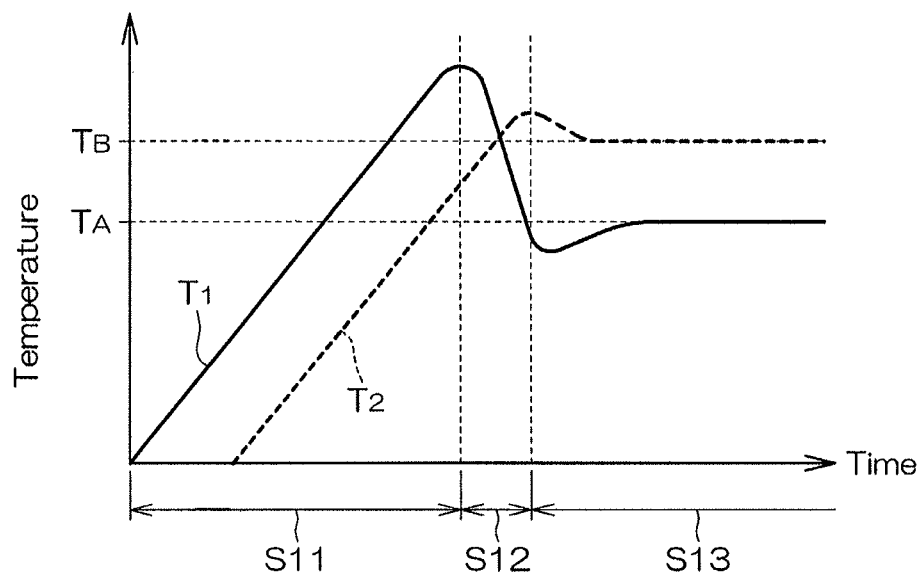
FIG. 17 is a graph showing changes in temperatures of an inner wall surface and the outer wall surface of the discharge port body in the equilibrium temperature adjusting step.

FIG. 16 is a flowchart showing contents of the thermal equilibrium temperature adjusting step. FIG. 17 is a graph showing changes in the temperatures of the inner wall surface 34B and the outer wall surface 34A of the discharge port 34 in the thermal equilibrium temperature adjusting step.

In the thermal equilibrium temperature adjusting step, the controller 3 controls the temperature adjusting units 80 to raise the control temperature of the temperature adjusting units 80 to an extremely high temperature. Thereby, the outer wall surfaces 34A of the discharge port bodies 34 are heated (S11 of FIG. 16: first heating step). By such heating of the outer wall surfaces 34A, as shown by a solid line in FIG. 17, the temperature $T_1$ of the outer wall surfaces 34A is raised to reach a high temperature (for example, about 160° C.). By thermal conduction, as shown by a broken line in FIG. 17, the temperature $T_2$ of the inner wall surfaces 34B is raised in conjunction with the temperature rise of the outer wall surfaces 34A. The temperature $T_1$ of the outer wall surfaces 34A is raised up to a predetermined high temperature which is higher than the thermal equilibrium temperature $T_B$ (for example, about 120° C.)

When a predetermined time period elapses after the start of heating, the controller 3 controls the temperature adjusting units 80 to lower the control temperature of the temperature adjusting units 80 to an extremely low temperature. Thereby, the outer wall surfaces 34A of the discharge port bodies 34 are radically cooled (S12 of FIG. 16: cooling step). By such cooling of the outer wall surfaces 34A, the temperature $T_1$ of the outer wall surfaces 34A of the discharge port bodies 34 is radically lowered to a temperature which is lower than the targeted low temperature $T_A$ (for example, about 40° C.)

Meanwhile, even after the cooling of the discharge port bodies 34 is started, the temperature $T_2$ of the inner wall surfaces 34B is raised. This is because the heat is not easily transmitted from the outer wall surfaces 34A to the inner wall surfaces 34B due to relatively large thermal capacity of the resin material making the discharge port bodies 34 and the distance between the inner wall surfaces 34B and the outer wall surfaces 34A. However, in conjunction with the elapse of time, the temperature rise of the inner wall surfaces 34B becomes gradual, and after that, the temperature $T_2$ of the inner wall surfaces 34B is gradually lowered.

When a predetermined time period elapses after the start of the cooling, the controller 3 controls the temperature adjusting units 80 to raise the control temperature of the temperature adjusting units 80 to a high temperature (for example, about 120° C.). Thereby, the outer wall surfaces 34A of the discharge port bodies 34 are heated (S13 of FIG. 16: second heating step). By such heating of the outer wall surfaces 34A, as shown by the solid line in FIG. 17, the temperature $T_1$ of the outer wall surfaces 34A is raised and the temperature $T_1$ of the outer wall surfaces 34A reaches the low temperature $T_A$. After reaching the low temperature $T_A$, the temperature $T_1$ of the outer wall surfaces 34A is maintained at the low temperature $T_A$. Meanwhile, the lowered temperature $T_2$ of the inner wall surfaces 34B reaches the targeted thermal equilibrium temperature $T_B$. After reaching the thermal equilibrium temperature $T_B$, the temperature $T_2$ of the inner wall surfaces 34B is maintained at the thermal equilibrium temperature $T_B$. Thereby, a state where the inner wall surfaces 34B of the discharge port bodies 34 are maintained at the thermal equilibrium temperature $T_B$ and the outer wall surfaces 34A of the discharge port bodies 34 are maintained at the low temperature $T_A$ can be realized by a relatively simple method. After that, the controller 3 continuously maintains the control temperature of the temperature adjusting units 80 at a high temperature (about 120° C.).

Figure 18:
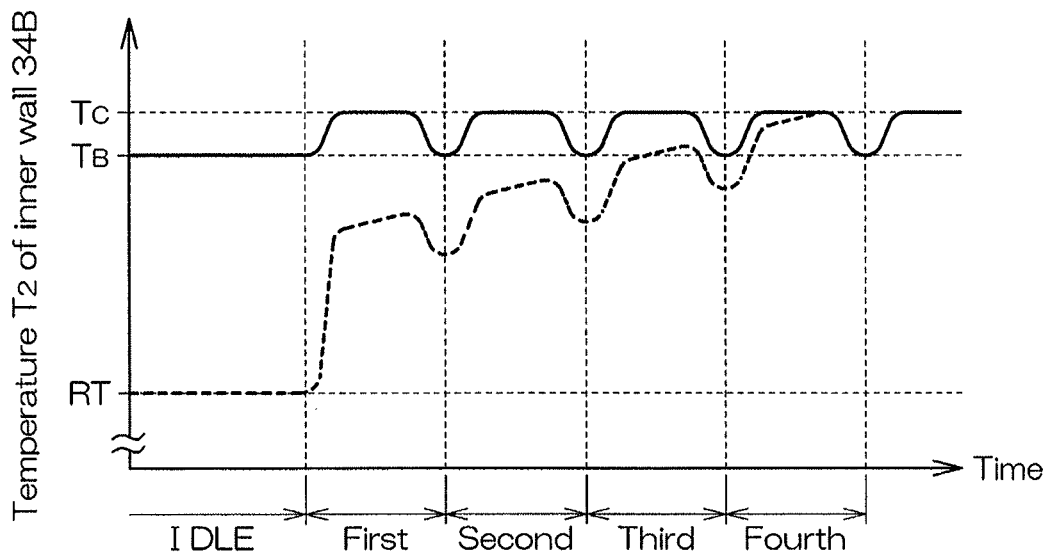
FIG. 18 is a graph showing a change in the temperature of the inner wall surfaces of the discharge port bodies in a case where a high-temperature chemical liquid step shown in FIG. 13 is consecutively executed.

FIG. 18 is a graph showing a change in the temperature $T_2$ of the inner wall surfaces 34B of the discharge port bodies 34 in a case where the high-temperature chemical liquid step (S4) shown in FIG. 13 is consecutively executed.

As described above, in the present preferred embodiment, immediately after the substrate processing apparatus 1 (that is, the processing liquid supply system) is started up, the heating by the temperature adjusting units 80 is started.

Therefore, in the IDLE state where the substrate processing apparatus 1 is started up but stands by (standby state where the nozzles are not used), the temperature $T_2$ of the inner wall surfaces 34B is maintained at the thermal equilibrium temperature $T_B$.

When the substrate W is carried in the substrate processing apparatus 1, the high-temperature chemical liquid step (S4 of FIG. 13) is repeatedly and consecutively executed for the substrate W. In the high-temperature chemical liquid step (S4), the chemical liquid whose temperature is adjusted to the predetermined temperature Tc in the second circulation flow passage 67 (see FIG. 6, etc.) is supplied to the communication passages 69 of the discharge port bodies 34 (see FIG. 15). At this time, as shown in FIG. 15, the temperature Tc of the chemical liquid supplied to the communication passages 69 is, for example, about 82° C., and the chemical liquid of the temperature is discharged from the discharge ports 31. The temperature $T_2$ of the inner wall surfaces 34B serving as pipe walls of the communication passages 69 is raised to substantially the same temperature as the temperature Tc by contact with the chemical liquid flowing through the communication passages 69.

Therefore, from the high-temperature chemical liquid step (S4 of FIG. 13) performed on the first substrate W after restoration from the IDLE state, the chemical liquid whose temperature is precisely adjusted to a high temperature can be discharged from the discharge ports 31. Since the temperature of the inner wall surfaces 34B of the discharge port bodies 34 is unchanged, even in the high-temperature chemical liquid step (S4 of FIG. 13) performed on the next substrate W, the chemical liquid of the same temperature can be discharged from the discharge ports 31. That is, the temperature of the chemical liquid discharged from the discharge ports 31 can be uniformly maintained over plural high-temperature chemical liquid steps (S4 of FIG. 13). Thereby, it is possible to reduce or prevent variations in high-temperature processing between the substrates W.

Meanwhile, a case where the nozzles are not heated in a non-use state is shown by a broken line in FIG. 18. In this case, at the time of the restoration from the IDLE state, the temperature $T_2$ of the inner wall surfaces 34B is the room temperature. At this time, even when the chemical liquid of the temperature Tc is supplied to the communication passages 69, heat exchange is performed with the inner wall surfaces 34B and the temperature of the chemical liquid is lowered. Therefore, the temperatures of the first several substrates W after the restoration from the IDLE state are low. By repeatedly and consecutively executing the high-temperature chemical liquid step (S4 of FIG. 13) after that, the temperature of the inner wall surfaces 34B is raised, and then, in a state where no chemical liquid is supplied, the temperature is maintained at the thermal equilibrium temperature $T_B$.

In the processing unit 2 of the substrate processing apparatus 1, temperatures of used chemical liquids may be different according to the type of the substrates W (lot unit). In such a case, after the substrate processing performed on the substrates W of the previous lot is ended, the temperature at which the discharge port bodies 34 are heated by the temperature adjusting units 80 is changed.

Specifically, in a case where a set temperature of the high-temperature chemical liquid in the recipe of the substrates W included in the substrate container C which is mounted on the load port LP is different from the previous set temperature, the controller 3 controls the temperature adjusting units 80 so that the temperature $T_2$ of the inner wall surfaces 34B of the discharge port bodies 34 disposed at the retract position P2 becomes a thermal equilibrium temperature corresponding to the new high-temperature chemical liquid, and the temperature $T_1$ of the outer wall surfaces 34A of the discharge port bodies 34 becomes a low temperature which is lower than the new thermal equilibrium temperature so that the outer wall surfaces 34A are maintained in a state of thermal equilibrium with the ambient atmosphere. In the high-temperature chemical liquid steps (S4 of FIG. 13) executed after that, the temperature $T_2$ of the inner wall surfaces 34B is continuously maintained at the thermal equilibrium temperature corresponding to the new high-temperature chemical liquid. Thereby, even in a case where the set temperature of the chemical liquid to be discharged is changed midway, it is possible to reduce or prevent variations in high-temperature processing between the substrates W after that.

As described above, according to the present preferred embodiment, by heating or cooling the outer wall surfaces 34A of the discharge port bodies 34 by the temperature adjusting units 80 (temperature changing unit) to change the temperature of the discharge port bodies 34, in a state where no high-temperature chemical liquid is supplied to the communication passages 69, the inner wall surfaces 34B of the discharge port bodies 34 are maintained at the thermal equilibrium temperature $T_B$.

The thermal equilibrium temperature $T_B$ is the temperature of the inner wall surfaces 34B of the discharge port bodies 34 converging in a case where the high-temperature chemical liquid step (S4: substrate processing step) is repeatedly and consecutively executed. By maintaining the inner wall surfaces 34B of the discharge port bodies 34 at the thermal equilibrium temperature $T_B$ in a state where no high-temperature chemical liquid is supplied to the communication passages 69, in the high-temperature chemical liquid step (S4) to be executed next, the inner wall surfaces 34B of the discharge port bodies 34 are maintained at the thermal equilibrium temperature $T_B$. In addition, in the high-temperature chemical liquid step (S4) to be executed repeatedly after that, the inner wall surfaces 34B of the discharge port bodies 34 are also maintained at the thermal equilibrium temperature $T_B$. That is, the temperature of the inner wall surfaces 34B of the discharge port bodies 34 is unchanged.

The high-temperature chemical liquid supplied to the communication passages 69 is brought into contact with the inner wall surfaces 34B of the discharge port bodies 34 maintained at the thermal equilibrium temperature $T_B$, and then discharged from the discharge ports 31. Since the temperature of the inner wall surfaces 34B of the discharge port bodies 34 is unchanged, the temperature of the chemical liquid discharged from the discharge ports 31 can be uniformly maintained over plural high-temperature chemical liquid steps (S4). Thereby, it is possible to reduce or prevent variations in high-temperature processing between the substrates W.

The outer wall surfaces 34A of the discharge port bodies 34 are maintained at the low temperature $T_A$ which is higher than the room temperature and lower than the thermal equilibrium temperature $T_B$. The low temperature $T_A$ is a temperature at which in the heated state from the temperature adjusting units 80, the outer wall surfaces 34A of the discharge port bodies 34 are maintained in a state of thermal equilibrium with the ambient atmosphere. Thereby, on the outer wall surfaces 34A of the discharge port bodies 34, it is possible to prevent heat from entering and exiting the discharge port bodies 34. Therefore, the inner wall surfaces 34B of the discharge port bodies 34 can be continuously maintained in a state of thermal equilibrium.

By heating the outer wall surfaces 34A of the discharge port bodies 34 by the temperature adjusting units 80, the temperature of the outer wall surfaces 34A of the discharge port bodies 34 is raised to a higher temperature than the thermal equilibrium temperature $T_B$. Next, by cooling the outer wall surfaces 34A of the discharge port bodies 34 by the temperature adjusting units 80, the temperature of the outer wall surfaces 34A of the discharge port bodies 34 is lowered. Next, by heating the outer wall surfaces 34A of the discharge port bodies 34 by the temperature adjusting units 80, the inner wall surfaces 34B of the discharge port bodies 34 are maintained at the thermal equilibrium temperature $T_B$, and the temperature of the outer wall surfaces 34A of the discharge port bodies 34 are maintained at the low temperature $T_A$. In this way, the state where the inner wall surfaces 34B of the discharge port bodies 34 are maintained at the thermal equilibrium temperature $T_B$ and the outer wall surfaces 34A of the discharge port bodies 34 are maintained at the low temperature $T_A$ can be realized by a relatively simple method.

The discharge port bodies 34 of the nozzles 22 disposed at the retract position P2 are heated or cooled by the temperature adjusting units 80. With the scanning type nozzles 22 movable between the processing position P1 and the retract position P2, the nozzles 22 are disposed at the retract position P2 for a long period of time within a time period in which no chemical liquid is supplied to the substrate W. By effectively utilizing the time period in which no chemical liquid is supplied to the substrate W, the discharge port bodies 34 can be warmed up.

The discharge port bodies 34 are made by using PCTFE, PTFE, or PFA. PCTFE, PTFE, and PFA are materials having large thermal capacity. Therefore, thermal conduction efficiency is poor. Since the discharge port bodies 34 are made by using such materials, there is a problem that the temperature of the discharge port bodies 34 is not easily changed. Therefore, in a case where the plural high-temperature chemical liquid steps (S4 of FIG. 13) are repeatedly performed in a state where the inner wall surfaces 34B of the discharge port bodies 34 are at, for example, the room temperature, the temperature of the inner wall surfaces 34B of the discharge port bodies 34 has variation for each of the high-temperature chemical liquid steps (S4). Thereby, there is a problem that the temperature of the chemical liquid discharged from the discharge ports 31 has variation. As a result, there is a possibility that variations in high-temperature processing between the substrates W become obvious.

Meanwhile, in the preferred embodiment, in a state where no high-temperature chemical liquid is supplied to the communication passages 69, the inner wall surfaces 34B of the discharge port bodies 34 are maintained at the thermal equilibrium temperature $T_B$. Thereby, the temperature of the chemical liquid discharged from the discharge ports 31 can be uniformly maintained over plural high-temperature chemical liquid steps (S4 of FIG. 13). Therefore, even in a case where the discharge port bodies 34 are made of the material having large thermal capacity, it is possible to effectively reduce or prevent variations in processing between the substrates W.

The preferred embodiment of the present invention is described above. However, the present invention can be implemented in other modes.

In the above preferred embodiment, a Peltier element is used as the heat source 83 of the temperature adjusting unit 80. However, the heat source may be divided into a heating source (heater) and a cooling source (cooler).

In the above processing example, pre-dispensing is not performed. However, the pre-dispensing may be performed prior to the high-temperature chemical liquid step (S4 of FIG. 13). In this case, the pre-dispensing is performed between the equilibrium temperature maintaining step (heating by the temperature adjusting units 80) and the substrate processing step (high-temperature chemical liquid step (S4)). In this case, the chemical liquid discharged from the discharge ports 31 for the pre-dispensing is received by the retract pot 27. Even in a case where the dispensing is performed, an amount of the chemical liquid to be discarded is only small. Thus, a consumption amount of the chemical liquid is only small, and a time required for the pre-dispensing is only a short time.

Plural temperature adjusting units 80 may be provided to individually correspond to the plural nozzles 22. In this case, the temperature of each of the nozzles 22 may be individually adjusted by the corresponding temperature adjusting unit 80.

In the above preferred embodiment, a Peltier element is used as the heat source 83 of the temperature adjusting unit 80. However, the heat source may be divided into a heating source (heater) and a cooling source (cooler).

As the high-temperature processing liquid, the high-temperature chemical liquid is taken as an example. However, the high-temperature processing liquid may be high-temperature water. In this case, the water may be, for example, pure water (deionized water). However, the water is not limited to pure water but may be any of carbonated water, electrolyzed ion water, hydrogen water, ozone water, and aqueous hydrochloric acid solution of dilute concentration (for example of about 10 to 100 ppm).

In the above preferred embodiment, the case where the plural nozzles 22 are provided is described. However, as long as the nozzles 22 are placed at the retract position P2 and heated (the temperature is changed) by the temperature adjusting units 80, not the plural nozzles 22 but a single nozzle 22 whose temperature is to be changed may be provided.

As long as the temperature $T_2$ of the inner wall surfaces 34B is maintained at the thermal equilibrium temperature $T_B$ in the heated state of the discharge port bodies 34 from the temperature adjusting units 80, the outer wall surfaces 34A of the discharge port bodies 34 may not be necessarily maintained at a lower temperature than the thermal equilibrium temperature $T_B$.

Although the case where the nozzles 22 are heated (the temperature is changed) by the temperature adjusting units 80 is described above, an object whose temperature is to be changed may not be the nozzles 22 but a processing liquid distributing member forming part of a processing liquid distribution passage. However, the object whose temperature is to be changed is limited to a portion on the downstream side of the circulation flow passage (second circulation flow passage 67).

In the above preferred embodiment, the case where the substrate processing apparatus 1 is the apparatus that processes the disk-shaped substrates W is described. However, the substrate processing apparatus 1 may be an apparatus that processes polygonal substrates such as glass substrates for liquid crystal displays.

While preferred embodiments of the present invention have been described in detail above, these are merely specific examples used to clarify the technical contents of the present invention, and the present invention should not be interpreted as being limited to these specific examples, and the scope of the present invention shall be limited only by the appended claims.

The present application corresponds to Japanese Patent Application No. 2017-060046 filed on Mar. 24, 2017 in the Japan Patent Office, and the entire disclosure of this application is incorporated herein by reference.

What is claimed is:

1. A substrate processing method comprising:
    a substrate processing step of processing a substrate held by a substrate holding unit by supplying a high-temperature processing liquid having a predetermined first temperature that is higher than a room temperature to a processing liquid distribution passage of a processing liquid distributing member and discharging the processing liquid from a discharge port communicating with the processing liquid distribution passage; and
    an equilibrium temperature maintaining step of maintaining an inner wall surface of the processing liquid distributing member at a thermal equilibrium temperature which is higher than the room temperature and lower than the first temperature by heating or cooling an outer wall surface of the processing liquid distributing member from the outside to change a temperature of the processing liquid distributing member in a state where the substrate processing step is not performed.

2. The substrate processing method according to claim 1, wherein the equilibrium temperature maintaining step includes a step of maintaining the inner wall surface at the thermal equilibrium temperature and maintaining the outer wall surface at a predetermined second temperature which is higher than the room temperature and lower than the thermal equilibrium temperature.

3. The substrate processing method according to claim 2, wherein the equilibrium temperature maintaining step includes:
    a first heating step of heating the outer wall surface in order to raise the temperature of the outer wall surface to a higher temperature than the thermal equilibrium temperature;
    a cooling step of, subsequent to the first heating step, cooling the outer wall surface in order to lower the temperature of the outer wall surface to a lower temperature than the temperature of the processing liquid; and
    a second heating step of, subsequent to the cooling step, heating the outer wall surface so that the inner wall surface of the processing liquid distributing member is maintained at the thermal equilibrium temperature and the temperature of the outer wall surface is maintained at the predetermined temperature.

4. The substrate processing method according to claim 1, wherein the equilibrium temperature maintaining step adjusts the thermal equilibrium temperature in the equilibrium temperature maintaining step according to the temperature of the processing liquid used in the substrate processing step which is executed after the equilibrium temperature maintaining step.

5. The substrate processing method according to claim 1, wherein the thermal equilibrium temperature is a temperature to which the inner wall surface converges in a case where the substrate processing step is repeatedly and consecutively executed a plurality of number of times.

* * * * *